United States Patent
Shiraishi et al.

(10) Patent No.: US 8,319,289 B2
(45) Date of Patent: Nov. 27, 2012

(54) POWER MISFET, SEMICONDUCTOR DEVICE AND DC/DC CONVERTER

(75) Inventors: Masaki Shiraishi, Hitachinaka (JP); Noboru Akiyama, Hitachinaka (JP); Takayuki Hashimoto, Tokai (JP)

(73) Assignee: Renesas Electronics Corporation, Kawasaki (JP)

( * ) Notice: Subject to any disclaimer, the term of this patent is extended or adjusted under 35 U.S.C. 154(b) by 21 days.

(21) Appl. No.: 12/005,918

(22) Filed: Dec. 27, 2007

(65) Prior Publication Data

US 2008/0180974 A1 Jul. 31, 2008

(30) Foreign Application Priority Data

Dec. 27, 2006 (JP) ................. 2006-352737

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. . 257/374; 257/501; 257/512; 257/E29.256; 363/24

(58) Field of Classification Search .............. 257/374, 257/501, 512, E29.256; 363/24
See application file for complete search history.

(56) References Cited

U.S. PATENT DOCUMENTS

| | | | | |
|---|---|---|---|---|
| 5,543,744 A * | 8/1996 | Okumura | ................ | 327/333 |
| 5,844,275 A * | 12/1998 | Kitamura et al. | ............ | 257/335 |
| 6,117,738 A * | 9/2000 | Tung | ................ | 438/286 |
| 6,707,102 B2 * | 3/2004 | Morikawa et al. | ............ | 257/340 |
| 6,861,702 B2 | 3/2005 | Kitamura | | |
| 6,888,205 B2 * | 5/2005 | Moscatelli et al. | ........... | 257/406 |
| 7,005,703 B2 * | 2/2006 | Shibib et al. | ................ | 257/335 |
| 7,145,203 B2 * | 12/2006 | Wang | ................ | 257/339 |
| 7,420,255 B2 * | 9/2008 | Shimizu | ................ | 257/409 |
| 7,473,976 B2 * | 1/2009 | Kocon | ................ | 257/408 |

FOREIGN PATENT DOCUMENTS

| | | |
|---|---|---|
| JP | 2002-9277 A | 6/2000 |
| JP | 2001-237423 A | 8/2001 |
| JP | 2003-031804 A | 1/2003 |
| JP | 2005-093775 A | 4/2005 |
| JP | 2005-129654 A | 5/2005 |

OTHER PUBLICATIONS

Grelu et al. "Switching loss optimization of 20V devices integrated in a 0.13 Âċ m CMOS technology for portable applications," Proceedings.of the 17th International Symposium on Power Semiconductor Devices and ICs 2005 pp. 339-342 (May 2005). Letavic et al. "20V Asymmetric Complementary Power Device Implementation within a 0.25μm CMOS Technology for Power Management," Proceedings.of the 17th International Symposium on Power Semiconductor Devices and ICs 2005 pp. 367-370 (May 2005).

\* cited by examiner

*Primary Examiner* — Howard Weiss
(74) *Attorney, Agent, or Firm* — Kilpatrick Townsend & Stockton LLP

(57) ABSTRACT

A technique for suppressing lowering of withstand voltage and lowering of breakdown resistance and reducing a feedback capacitance of a power MISFET is provided. A lateral power MISFET that comprises a trench region whose insulating layer is formed shallower than an HV-Nwell layer is provided in the HV-Nwell layer (drift region) formed on a main surface of a semiconductor substrate in a direction from the main surface to the inside. The lateral power MISFET has an arrangement on a plane of the main surface including a source layer (source region) and a drain layer (drain region) arranged at opposite sides to each other across a gate electrode (first conducting layer), and a dummy gate electrode (second conducting layer) that is different from the gate electrode is arranged between the gate electrode and the drain layer.

11 Claims, 24 Drawing Sheets

MOSFET 100 (BVdss=25.8V)

MOSFET 700 (BVdss=23.8V)

MOSFET 100 (Ron・Aa=14.7Ω・mm²)

MOSFET 700 (Ron · Aa=14.6Ω · mm²)

(a) FORMATION OF EPITAXIAL LAYER (b) FORMATION OF HV-Nwell LAYER (c) FORMATION OF STI REGION (d) FORMATION OF CMOS well LAYER (e) FORMATION OF GATE/DUMMY GATE (f) FORMATION OF p⁻ CHANNEL LAYER (g) FORMATION OF LDD LAYER (h) FORMATION OF SIDEWALL (i) FORMATION OF $n^+$ / $p^+$ LAYER (j) SALICIDATION (k) ELECTRODE/WIRING PROCESS

POWER MISFET, SEMICONDUCTOR DEVICE AND DC/DC CONVERTER

CROSS-REFERENCE TO RELATED APPLICATION

The present application claims priority from Japanese Patent Application No. JP 2006-352737 filed on Dec. 27, 2006, the content of which is hereby incorporated by reference into this application.

TECHNICAL FIELD OF THE INVENTION

The present invention relates to a power MISFET (Metal Insulator Semiconductor Field Effect Transistor). More particularly, the present invention relates to a technique effectively applied to a power MISFET used for a switch of a DC/DC converter circuit and the like.

BACKGROUND OF THE INVENTION

For example, in the ISPSD (International Symposium on Power Semiconductor Devices & ICs) '05 pp. 367-370 (Non-Patent Document 1), T. Letavic et al. teach a structure in which, for the CMOS (Complementary Metal Oxide Semiconductor) process of 0.25 μm rule or below, an STI (Shallow Trench Isolation) region that is a trench device isolation region shallower than a generally used drift region for device isolation is arranged in a drift region of a power MOSFET.

In addition, in the ISPSD '05 pp. 339-342 (Non-Patent Document 2), C. Grelu et al. make a similar report.

SUMMARY OF THE INVENTION

Non-isolated DC/DC converter circuits employed in power supply circuits of desk-top PCs, laptops, game machines and the like have been in a trend of larger-current configuration and higher-frequency configuration along with the requirements for the large-current configuration of CPU (Central Processing Unit) and MPU (Micro Processing Unit) driven by DC/DC converters and compact configurations of choke coils as passive parts, input/output capacitors and the like. The DC/DC converter circuit is structured by a high-side switch and a low-side switch, and in the switches, MISFETs (Metal Insulator Semiconductor Field Effect Transistors) such as a power MISFET (Metal Insulator Semiconductor-Field Effect Transistor) and the like are employed respectively.

These switches convert voltage by alternately turning ON/OFF the high side and the low side while synchronizing these. The high-side switch is a switch for controlling the DC/DC converter, and the low-side switch becomes a switch for synchronous rectification.

Herein, with regard to a loss in the high-side switch, a switching loss that occurs at switching is the main loss, and a reduction of ON resistance (Ron) is required to the power MISFET used in the high-side switch and a reduction of feedback capacitance (Crss) is required as well. Further, with regard to a loss in the low-side switch, a conduction loss is the main loss, and thus a reduction of ON resistance (Ron) is required to the power MISFET used in the low-side switch.

Further, in the DC/DC converter, there occurs a problem called self turn-on. The self turn-on is a phenomenon that, when the high-side switch is turned ON while the low-side switch is in the OFF state, a drain voltage of the low-side switch increases, and along with the voltage change a charging current flows between a gate and drain of the low-side switch via a feedback capacitor between the gate and drain of the low-side switch, and then a gate voltage of the low-side switch increases and exceeds a threshold voltage, and so the low-side switch causes a false firing.

When the self turn-on occurs, from the high-side switch to the low-side switch, a large through current flows, and the conversion efficiency is reduced significantly. Since the increase value of the gate voltage of the low-side switch is in proportion to the ratio (Crss/Ciss) of the feedback capacitance of the low-side switch to the input capacitance (Ciss), the reduction of Crss/Ciss is also required to the low-side switch.

In the present DC/DC converter, since the operation frequency thereof becomes around 300 kHz which is not so high, a vertical power MOSFET having a trench structure (hereinafter, referred to as trench power MOSFET) is mainly used together with both the high-side switch and the low-side switch.

The trench power MOSFET is capable of reducing the cell size thereof and not generating a JFET resistance compound, thereby realizing a low ON resistance. However, the feedback capacitance is large in the trench power MOSFET, and consequently, as the DC/DC converter gets to have a higher frequency, there arises a problem that its switching loss and loss due to the self turn-on become larger.

On the other hand, as a power MOSFET having a small feedback capacitance, there is a lateral power MOSFET shown in FIG. 25. Meanwhile, in order to ease the electric field at the gate edge, it is necessary to form a thick oxide film 26 (LOCOS: Local Oxidation of Silicon) in an HV-Nwell layer 4 as a drift region. As a result, the cell size becomes large and there arises another problem that it is difficult to reduce the ON resistance.

Further, as a structure of a lateral power MOSFET not having the LOCOS, there is an RF (Radio Frequency) power MOSFET shown in FIG. 26. But, since the oxide film at the gate edge is thin, its withstand voltage is reduced and its breakdown resistance is small. And since a p+ punch-through diffusion layer 22 for taking a source electrode from a back surface is large, the cell size becomes large and thus there arises still another problem that the ON resistance is large.

Consequently, in the Non-Patent Document 1 and the Non-Patent Document 2, as shown in FIG. 27, in a CMOS process of 0.25 μm rule or below, an STI (Shallow Trench Isolation) region as a trench region where an insulating film generally used for device isolation is formed is arranged in a drift region of a power MOSFET, so that the electric field at the gate edge is eased and a structure of a lateral power MOSFET having a withstand voltage around 30 V is provided.

Note that, in the Non-Patent Document 1 and the Non-Patent Document 2, the trench region is described as an STI since it is manufactured in the same process as that for a general device isolation region. However, the trench region arranged in the drift region is a trench region where an insulating layer for controlling the withstand voltage lowering of the power MOSFET is formed, which is different from the STI used for device isolation in CMOS process.

As shown in FIG. 27, by use of a trench region 16, in comparison with the case using the LOCOS, it is possible to reduce a width (length in the direction along a main surface) of a thick oxide film, thereby making the cell size small and reducing the ON resistance.

However, according to the structures disclosed in the Non-Patent Document 1 and the Non-Patent Document 2, in order to keep the withstand voltage around 30 V, the distance between the channel and drain becomes long. Therefore, a protruding portion 27 from a p− channel layer 9 of the gate electrode shown in FIG. 27 becomes large, and so the feedback capacitance is large, which is yet another problem.

FIG. 28 shows a computed waveform of the gate voltage of the low-side switch in the case where the lateral power MOSFET of the structure shown in FIG. 27 is used to the low-side switch of a DC/DC converter. As shown in FIG. 28, the gate voltage surges over 2V, and the self turn-on where the MOSFET is led to a false firing occurs.

Accordingly, an object of the present invention is to provide a technique for reducing the feedback capacitance of the lateral power MISFET as well as suppressing the reduction of withstand voltage and the reduction of breakdown resistance thereof.

The above and other objects and novel characteristics of the present invention will be apparent from the description of this specification and the accompanying drawings.

The typical ones of the inventions disclosed in this application will be briefly described as follows.

More particularly, according to the present invention, there is provided a power MISFET that includes a trench region in which an insulating layer is formed so as to be shallower than a drift region in a direction from a main surface to the inside of a semiconductor, and an arrangement on the plane of the main surface is configured so that a source region and a drain region are arranged at mutually opposite sides across a gate electrode and a conducting layer different from the gate electrode is arranged between the gate electrode and the drain region.

The effects obtained by typical aspects of the present invention will be briefly described below.

More particularly, it is possible to realize a power MISFET that reduces the feedback capacitance without changing the withstand voltage and the ON resistance.

Further, since the power MISFET is used to both the high-side switch and the low-side switch of a DC/DC converter, the reduction of switching loss and the prevention of self turn-on can be realized, and accordingly, it is possible to reduce the loss of the system.

BRIEF DESCRIPTIONS OF THE DRAWINGS

Figure 28:
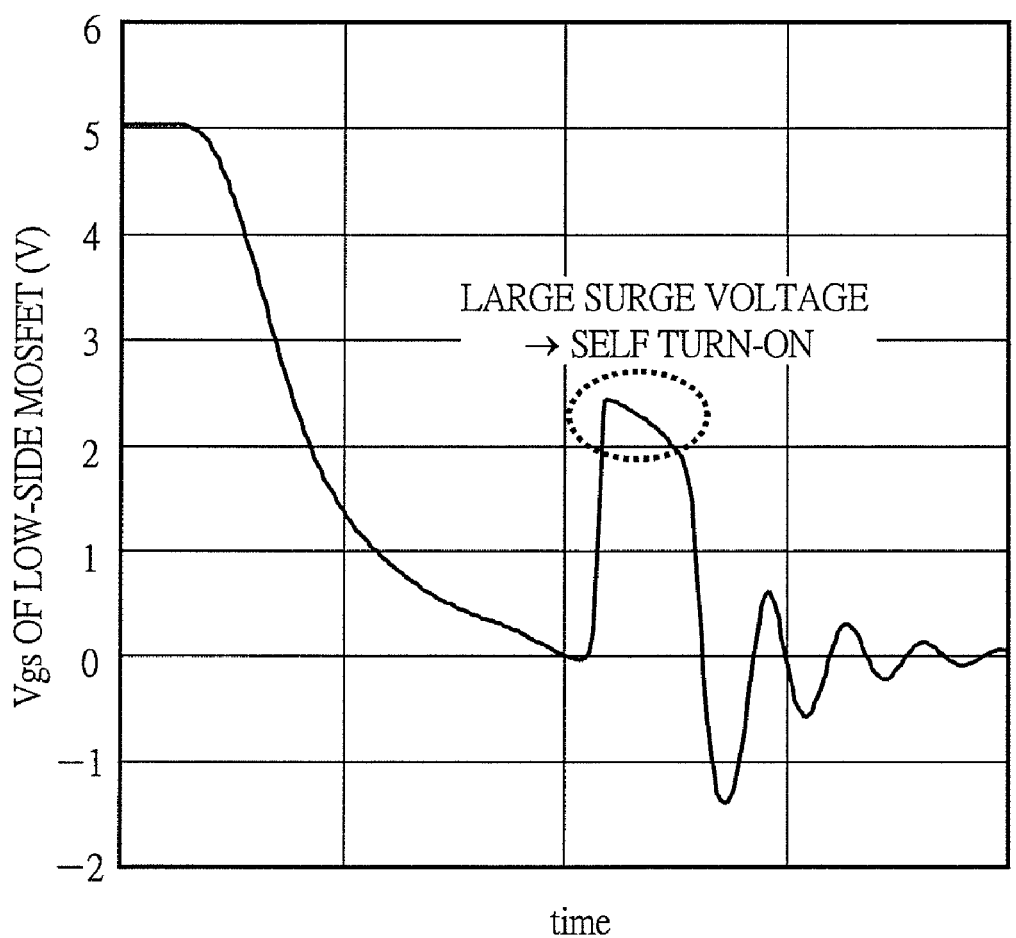
Figure 29:
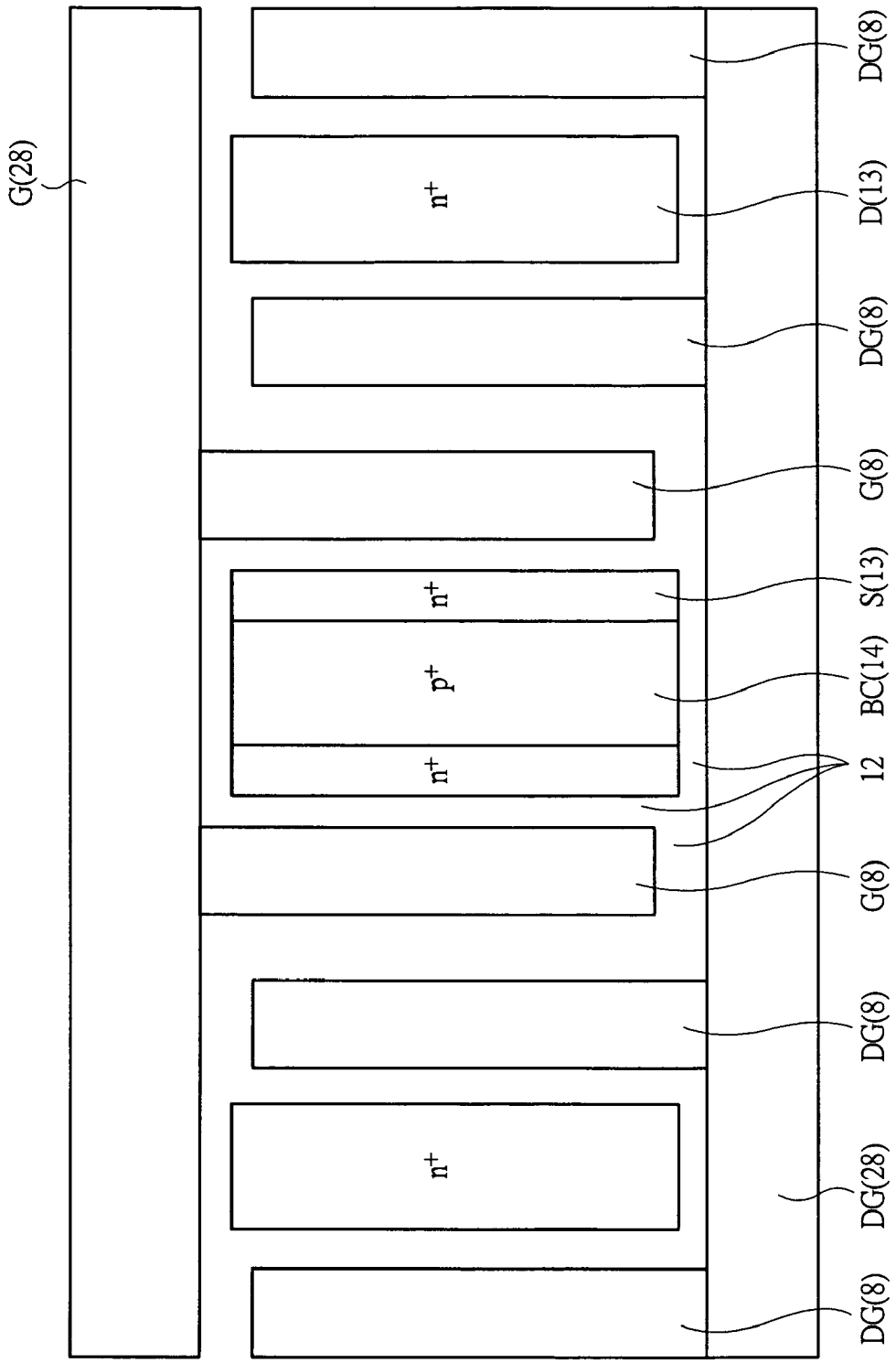

FIG. 28 is an explanatory diagram showing a surge of gate voltage in the case where the lateral power MOSFET having a trench region in a drift region thereof of the comparative example of the present invention is used to a low-side switch of a DC/DC converter; and FIG. 29 is an explanatory diagram showing how to draw out gate electrodes and dummy gate electrodes of the lateral power MOSFET according to the first embodiment of the present invention.

DESCRIPTIONS OF THE EMBODIMENTS

Hereinafter, embodiments according to the present invention will be described in details with reference to the accompanying drawings.

First Embodiment

In a first embodiment, as an example of a power MISFET, a lateral power MOSFET in which a source region, a channel region, a drift region and a drain region are arranged in sequence along one main surface of a semiconductor substrate, will be described as an instance.

Figure 1:
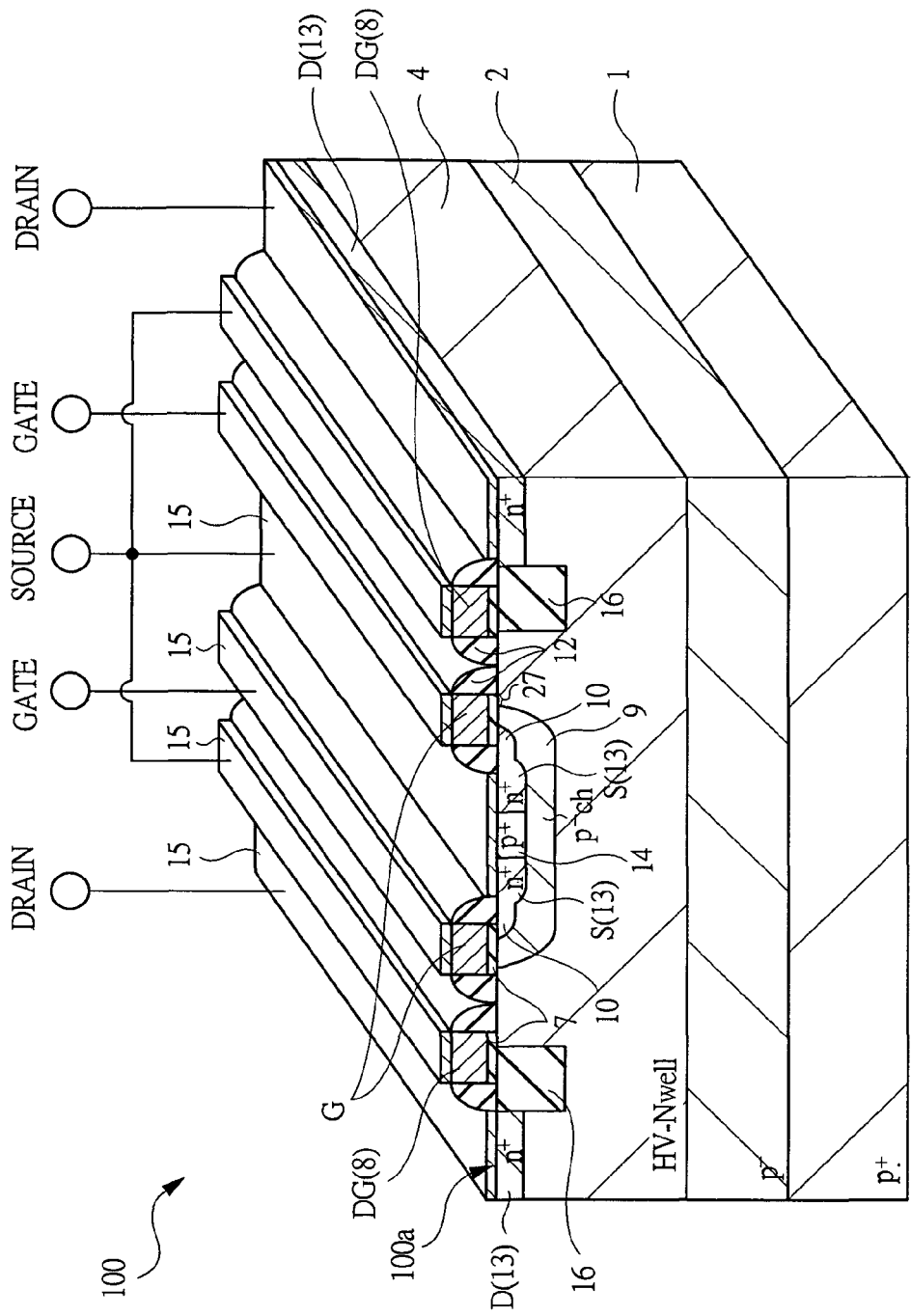
FIG. 1 is a perspective view showing a cross sectional structure of a lateral power MOSFET according to a first embodiment of the present invention.

FIG. 1 is a perspective view showing a cross sectional structure of main parts of an n-type lateral power MOSFET according to the first embodiment.

In FIG. 1, the lateral power MOSFET 100 comprises a $p^+$ substrate 1 of p-type (first conducting type) and a first impurity concentration. Further, on the $p^+$ substrate 1, a $p^-$ epitaxial layer 2 of the first conducting type and a second impurity concentration lower than the first impurity concentration is arranged. In other words, the lateral power MOSFET 100 has a semiconductor substrate formed of the $p^+$ substrate 1 and the $p^-$ epitaxial layer 2.

Further, on the $p^-$ epitaxial layer 2, an Nwell (hereinafter, referred to as "well") layer 4 of n-type (second conducting type) which is the opposite conducting type to the first conducting type and of a third impurity concentration lower than the first impurity concentration is arranged. This Nwell layer 4 is an HV (High Voltage) Nwell layer 4 for high withstand voltage, and this HV-Nwell layer 4 becomes the drift region of the lateral power MOSFET 100.

Herein, FIG. 1 is a figure showing the cross sectional structure of the main parts of the lateral power MOSFET 100. Although not illustrated therein, the $p^-$ epitaxial layer 2 as a part of the semiconductor substrate is formed around the HV-Nwell layer 4. That is, the $p^-$ epitaxial layer 2 is formed not merely under the HV-Nwell layer 4 as shown in FIG. 1, but also as sidewalls thereof).

On the main surface 100a of the semiconductor substrate as the main surface at the opposite side to the surface where the HV-Nwell layer 4 contacts the $p^-$ epitaxial layer 2, a $p^-$ channel layer (channel region) 9, an $n^+$ layer 13 that becomes a drain layer D or a source layer S, a $p^+$ layer 14 as a body contact layer, and an $n^-$ LDD (Lightly Doped Drain) layer 10 for preventing the $p^-$ channel layer 9 from punch through are selectively formed.

On the main surface 100a of the semiconductor substrate, along the main surface 100a, the source layer S, the $p^-$ channel layer 9, the HV-Nwell layer 4, and the drain layer D are arranged in sequence.

Further, in the HV-Nwell layer 4 as the drift region viewed from the main surface 100a, in the direction from the main surface 100a to the inside (inside chip), a trench region 16 formed shallower than the drift region is comprised. In this trench region 16, an insulating layer of, for example, an oxide film or the like is formed.

This trench region 16 is distinguished from the STI (Shallow Trench Isolation) region used for device isolation in the CMOS process. That is, the trench region 16 is the region where an insulating film that is not used for device isolation, but used for controlling the withstand voltage lowering of the lateral power MOSFET 100 is formed.

Further, on the main surface 10a, a polysilicon 8 as a gate electrode (first conducting layer) G or a dummy gate electrode (second conducting layer) DG is formed via the gate insulating film 7. Herein, the gate insulating film 7 may be either an oxide film or an oxynitride film, and further, the polysilicon 8 for the gate electrode G and the dummy gate electrode DG may be either n-type polysilicon or p-type polysilicon.

In an ordinary n-type power MOSFET, the n-type polysilicon electrode is used to the gate electrode, however, since the channel layer is tend to punch through when the ultrafine configuration of devices progresses, by use of the p-type polysilicon electrode in addition to the arrangement of the LDD layer, means for preventing the punch through may be applied.

The surfaces of the gate electrode G and the drain layer D, the source layer S are salicided by use of the side wall 12, and a silicide layer 15 is formed on the respective surfaces. As the silicide layer 15, cobalt silicide ($CoSi_2$) or titanium silicide ($TiSi_2$) or the like may be preferably employed.

A first structural characteristic of the lateral power MOSFET 100 according to the first embodiment is the point that, in the lateral power MOSFET having the trench region in the drift region, a dummy gate is arranged between the gate and the drain on the main surface.

In other words, with regard to the arrangement on the plane of the main surface of the semiconductor substrate 100a, the source layer S and the drain layer D are arranged at mutually opposite sides across the gate electrode D, and the dummy gate electrode DG is arranged between the gate electrode G and the drain layer D.

Herein, the dummy gate electrode DG is in common with the gate electrode G in the point that it is formed on the main surface 100a via the gate insulating film 7. Meanwhile, it has structural characteristics different from those of the gate electrode G.

First, at a lower part of the dummy gate electrode DG viewed from the main surface 100a, the $p^-$ channel layer 9 is not formed. Further, the dummy gate electrode DG is electrically connected with the source layer S as shown in FIG. 1. Therefore, the dummy gate electrode DG does not function as the gate of the lateral power MOSFET 100.

By arranging the dummy gate electrode DG, even when a protruding portion 27 of the $p^-$ channel layer 9 of the gate electrode G is made small, an electric field occurring at the moment of reverse biasing is distributed at the gate edge and the dummy gate edge, thereby suppressing and preventing the feedback capacitance without reducing the withstand voltage and breakdown resistance.

Furthermore, the edge portion of the dummy gate electrode DG at the side of the drain D viewed in a direction from the drain D to the semiconductor substrate overlaps the trench region 16 and is protected with the insulating film. Therefore, it is possible to suppress and prevent the problems of the reduction of withstand voltage and breakdown resistance and the like due to the electric field concentration.

Figure 2:
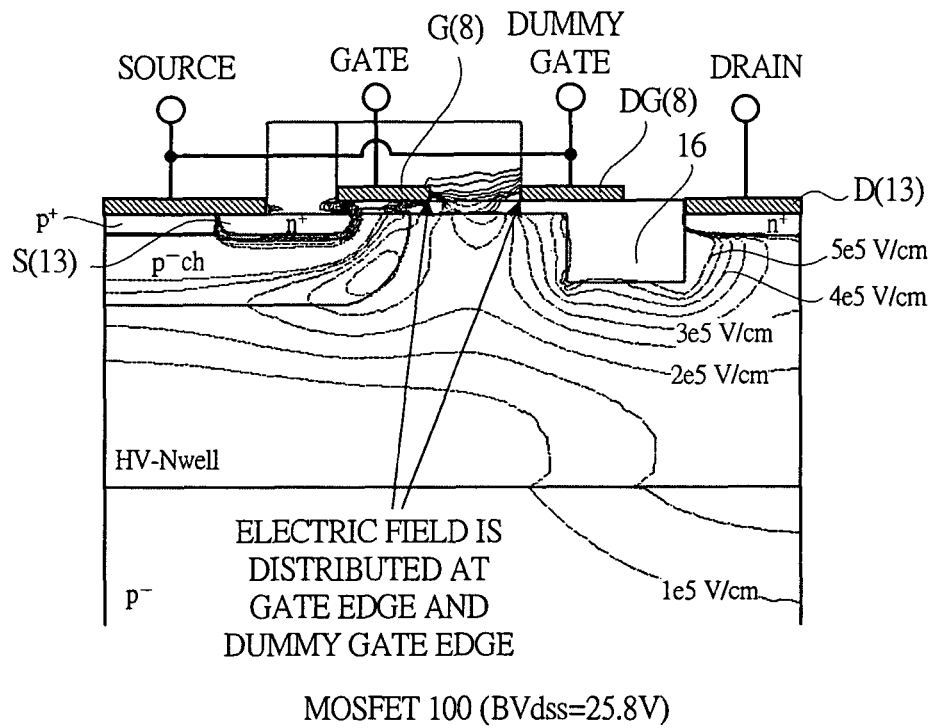
FIG. 2 is a cross-sectional view showing an electric field distribution at the reverse breakdown of the lateral power MOSFET according to the first embodiment of the present invention.
Figure 3:
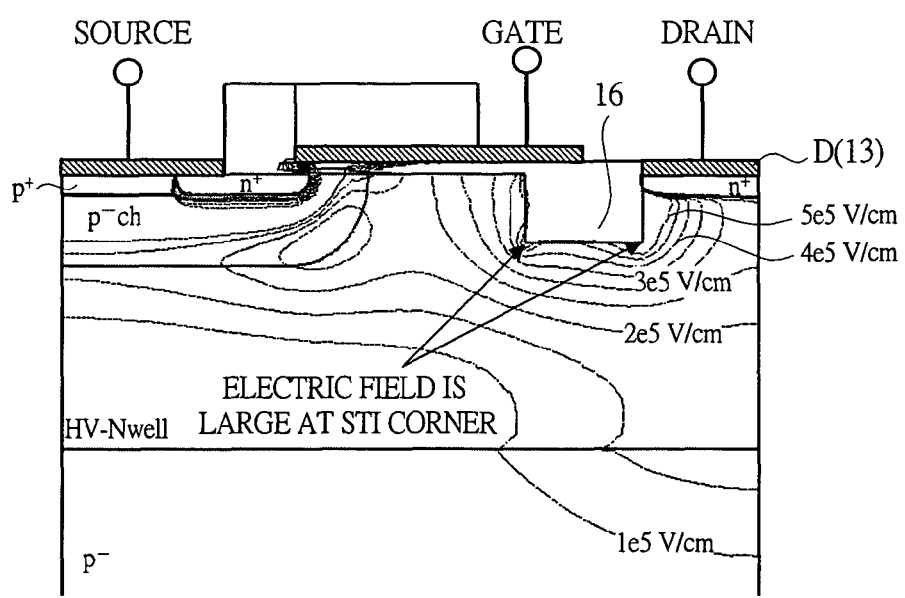
FIG. 3 is a cross-sectional view showing an electric field distribution at the reverse breakdown of a lateral power MOSFET shown in FIG. 27 as a comparative example of the first embodiment of the present invention.

FIG. 2 is an explanatory diagram showing an electric field distribution at reverse backdown of the lateral power MOSFET 100 according to the first embodiment shown in FIG. 1. And, FIG. 3 is an explanatory diagram showing an electric field distribution at reverse backdown of the lateral power MOSFET 700 shown in FIG. 27 as a comparative example to the first embodiment.

In the lateral power MOSFET 100 according to the first embodiment shown in FIG. 2, as pointed by arrows in FIG. 2, the electric field intensity is distributed at the gate edge and the dummy gate edge arranged so as to oppose to each other. And consequently, it is possible to hold the withstand voltage equivalent to that of the lateral power MOSFET 700 having the structure shown in FIG. 3.

Figure 4:
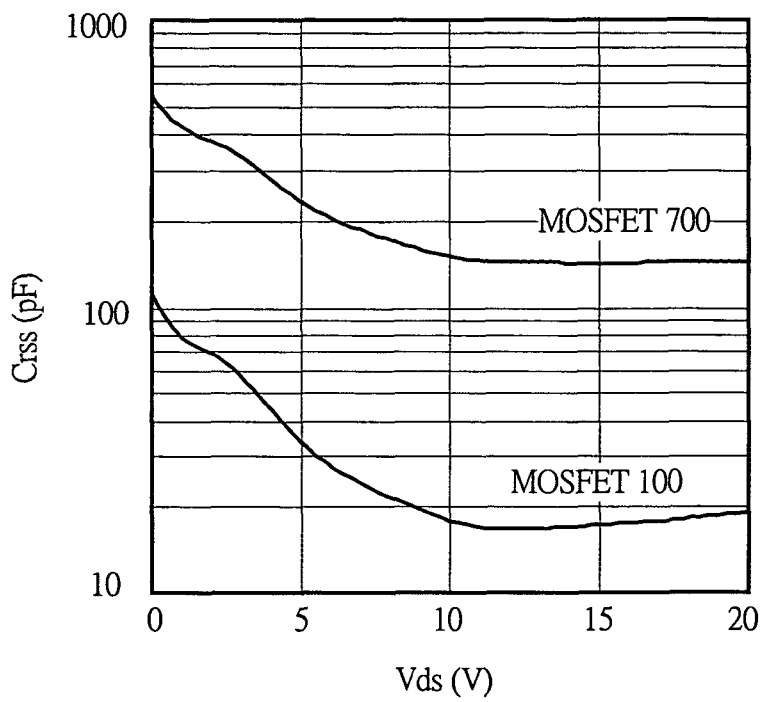
FIG. 4 is an explanatory diagram showing a dependence of a feedback capacitance to a voltage between a drain and source of the lateral power MOSFET according to the first embodiment of the present invention as the lateral power MOSFET as a comparative example.
Figure 27:
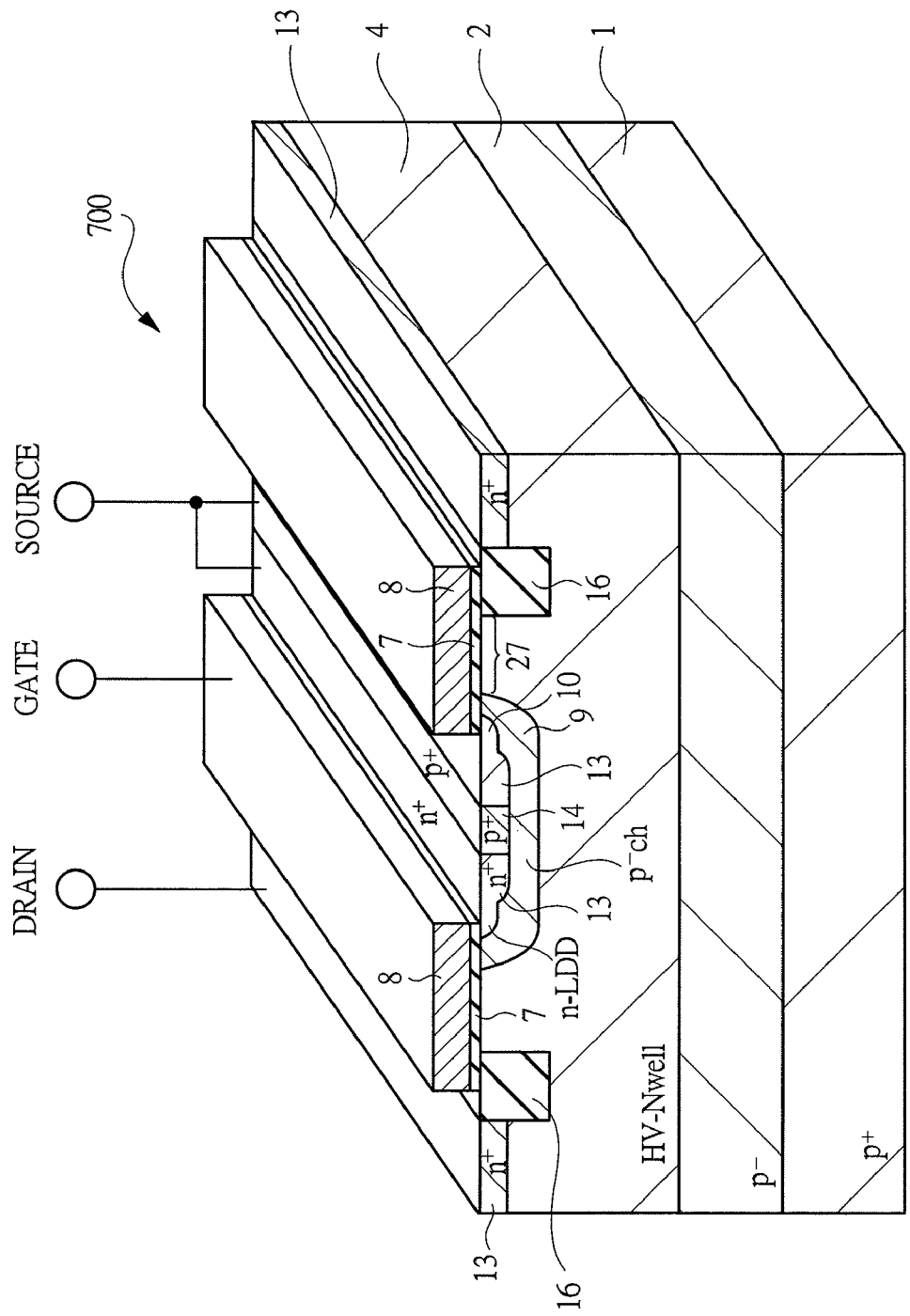
FIG. 27 is a cross-sectional view showing a lateral power MOSFET having a trench region in a drift region thereof as a comparative example of the present invention.

Next, the feedback capacitances (Crss) of the lateral power MOSFET 100 according to the first embodiment shown in FIG. 1 and the lateral power MOSFET 700 shown in FIG. 27 are described. FIG. 4 is an explanatory diagram showing the dependence of the feedback capacitance of the lateral power MOSFET 100 shown in FIG. 1 and the lateral power MOSFET 700 shown in FIG. 27 to the voltage between the drain and source.

In FIG. 1 and FIG. 27, when the respective areas of the protruding portions 27 of the gate from the p⁻ channel layers 9 are compared, in the lateral power MOSFET 100 according to the first embodiment, by arranging the dummy gate electrode DG, it is possible to make the protruding portion 27 of the gate electrode G from the p⁻ channel layer 9 smaller than that in the lateral power MOSFET 700.

As mentioned previously, the smaller the area of the protruding portion of the gate electrode from the channel layer is made, the smaller the feedback capacitance (Crss) of the lateral power MOSFET can be made. Therefore, as shown in FIG. 4, in the lateral power MOSFET 100, it is possible to reduce the feedback capacitance (Crss) by about 80%, in comparison with the lateral power MOSFET 700.

Figure 5:
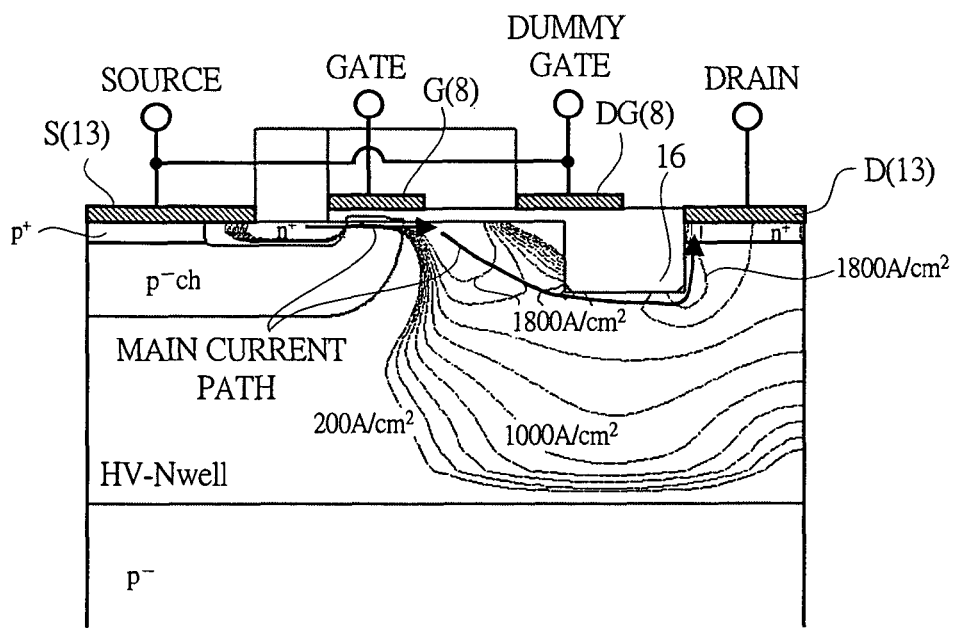
FIG. 5 is a cross-sectional view showing a current density distribution in the conducted state of the lateral power MOSFET according to the first embodiment of the present invention.

Next, regulated ON resistance (Ron•Aa) is described. FIG. 5 is an explanatory diagram showing a current density distribution in a conducted state of the lateral power MOSFET 100 according to the first embodiment shown in FIG. 1. And, FIG. 6 is an explanatory diagram showing a current density distribution in a conducted state of the lateral power MOSFET 700 shown in FIG. 27 as a comparative example to the first embodiment.

Figure 6:
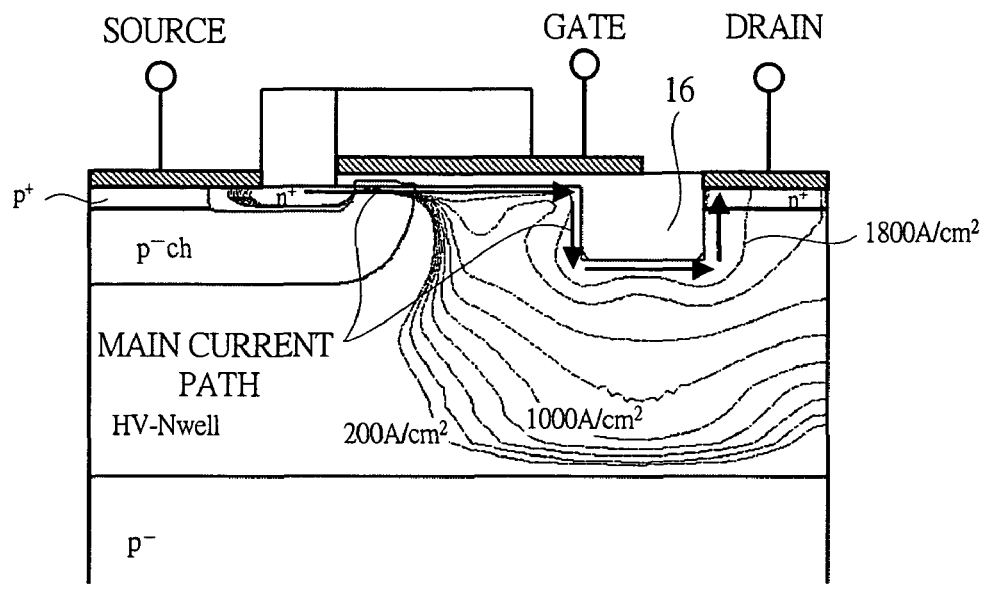
FIG. 6 is a cross-sectional view showing a current density distribution in the conduction state of the lateral power MOSFET shown in FIG. 27 of the comparative example of the first embodiment of the present invention.

As shown in FIG. 6, the current in the lateral power MOSFET 700 flows through an accumulation layer having a low resistance until it hits the trench region 16 because the protruding portion 27 of the p⁻ channel layer 9 of the gate works as an accumulation layer, and thereafter, it flows through a narrow path along the trench region.

On the other hand, the current in the lateral power MOSFET 100 according to the first embodiment shown in FIG. 5 flows spreading in the inside of the HV-Nwell layer 4 because there is hardly an accumulation layer, and thereafter, it flows along the trench region.

In other words, the current in the lateral power MOSFET 700 flows through the accumulation layer having a low resistance while the current path is narrow. On the other hand, the current of the lateral power MOSFET 100 according to the first embodiment flows in the inside of the HV-Nwell layer 4 since there is hardly an accumulation layer while the current path is wide. Therefore, the lateral power MOSFET 100 according to the first embodiment can have a regulated ON resistance (Ron•Aa) comparable with that of the lateral power MOSFET 700.

According to the foregoing, by arranging the dummy gate electrode DG between the gate electrode G and the drain layer D of the main surface 100a, the lateral power MOSFET 100 according to the first embodiment can reduce the feedback capacitance by about 80% in comparison with the lateral power MOSFET 700 shown in FIG. 27 without changing the withstand voltage and ON resistance.

Figure 7:
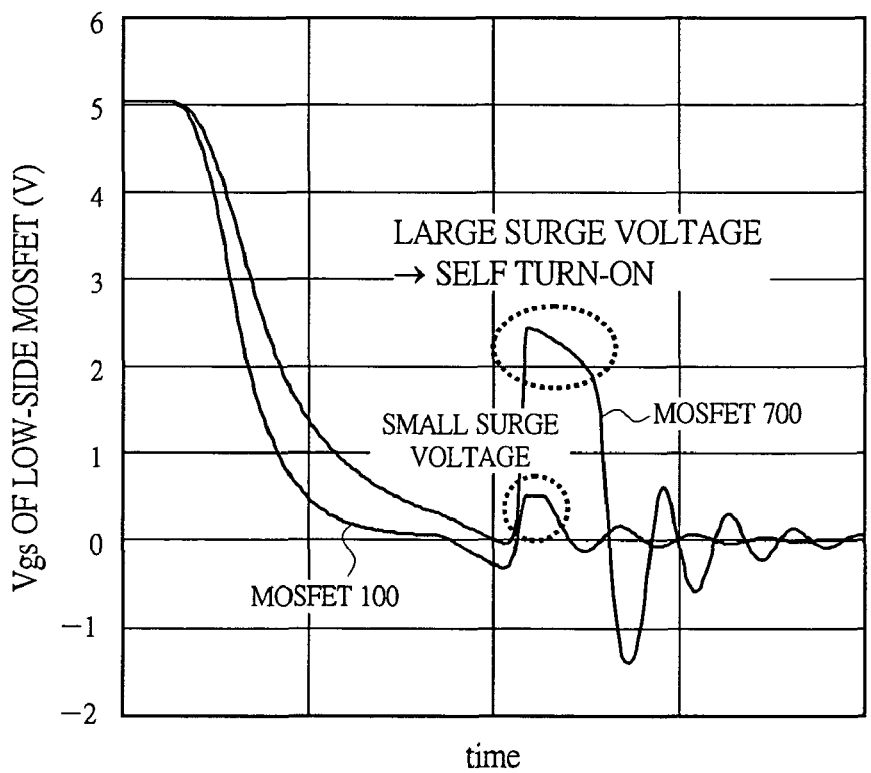
FIG. 7 is an explanatory diagram showing a comparison of gate surge voltages when the lateral power MOSFET according to the first embodiment of the present invention and the lateral power MOSFET of the comparative example thereof are used as a low-side switch of a DC/DC converter.

Next, a case where the lateral power MOSFET 100 according to the first embodiment is used as a low-side switch of a DC/DC converter is described. FIG. 7 is an explanatory diagram showing a comparison of surge voltages of gates when the lateral power MOSFET 100 according to the first embodiment shown in FIG. 1 and the lateral power MOSFET 700 shown in FIG. 27 are each used as the low-side switch of a DC/DC converter.

As shown in FIG. 7, in the lateral power MOSFET 100, the feedback capacitance can be reduced by approximately 80%, and the surge voltage thereof becomes 0.5V or less and the self turn-on does not occur while the surge voltage of the lateral power MOSFET 700 becomes 2V or more and the self turn-on occurs.

In other words, it can be considered that, in the case when the lateral power MOSFET 100 according to the first embodiment is used as the low-side switch of a DC/DC converter, it is possible to prevent the self turn-on that causes the increase of loss in a DC/DC converter.

Further, since the feedback capacitance of the lateral power MOSFET 100 according to the first embodiment is small, when it is used as the high-side switch of a DC/DC converter, it is possible to reduce the switching loss.

As a modified example of the lateral power MOSFET 100 according to the first embodiment, a lateral power MOSFET may be structured by the lateral power MOSFET device shown in FIG. 1 and a CMOS (Complementary Metal Oxide Semiconductor) device that drives the lateral MOSFET device arranged in a same chip.

Figure 19:
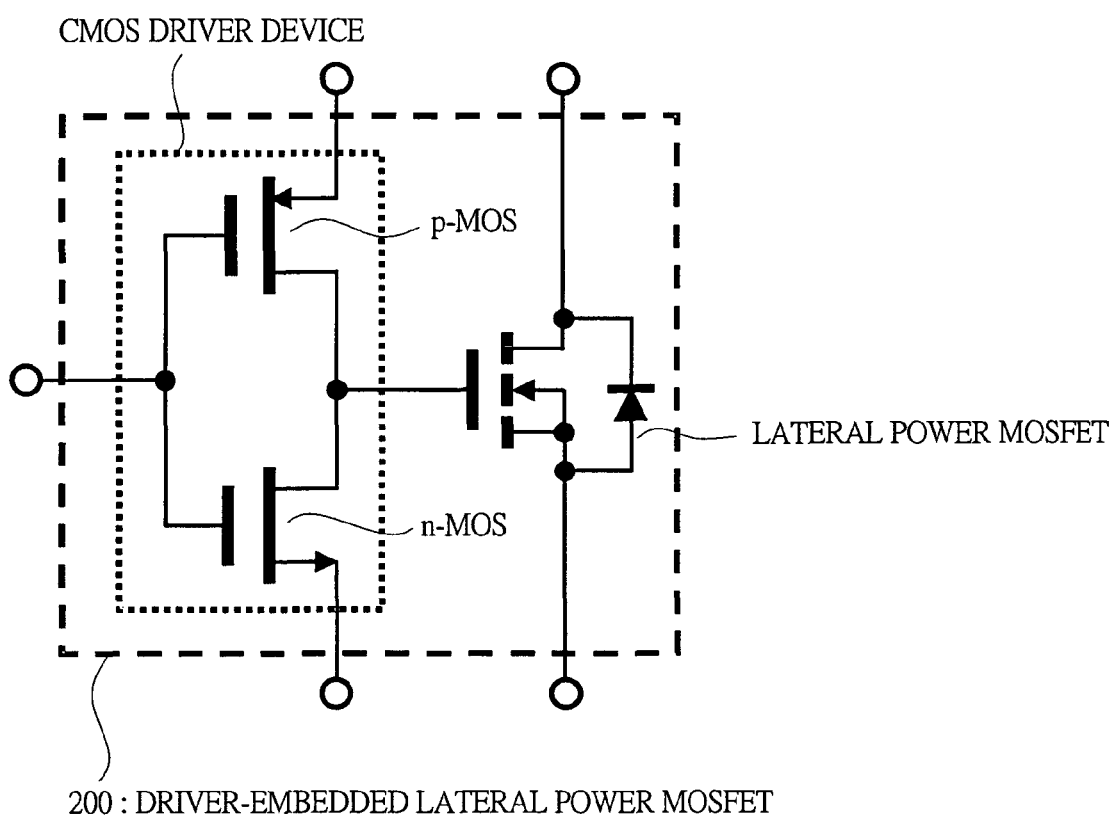
FIG. 19 is a circuit diagram showing a circuit structure embedding a driver comprised of the lateral power MOSFET and the CMOS device according to the first embodiment of the present invention.

FIG. 19 is a circuit diagram of a driver-embedded power MOSFET in which a CMOS driver device for driving is embedded in the lateral power MOSFET. By the structure where the lateral power MOSFET device and the CMOS device are arranged in a same chip, as shown in FIG. 19, it is possible to structure a driver-embedded power MOSFET having a driver for driving the lateral power MOSFET.

Next, with reference to FIG. 8 through FIG. 18, a process flow of a lateral power MOSFET 200 as the driver embedded power MOSFET shown in FIG. 19 is described. FIG. 8 through FIG. 18 are cross-sectional views showing the process flow of the structure having the lateral power MOSFET device and the CMOS device according to the first embodiment.

Figure 8:
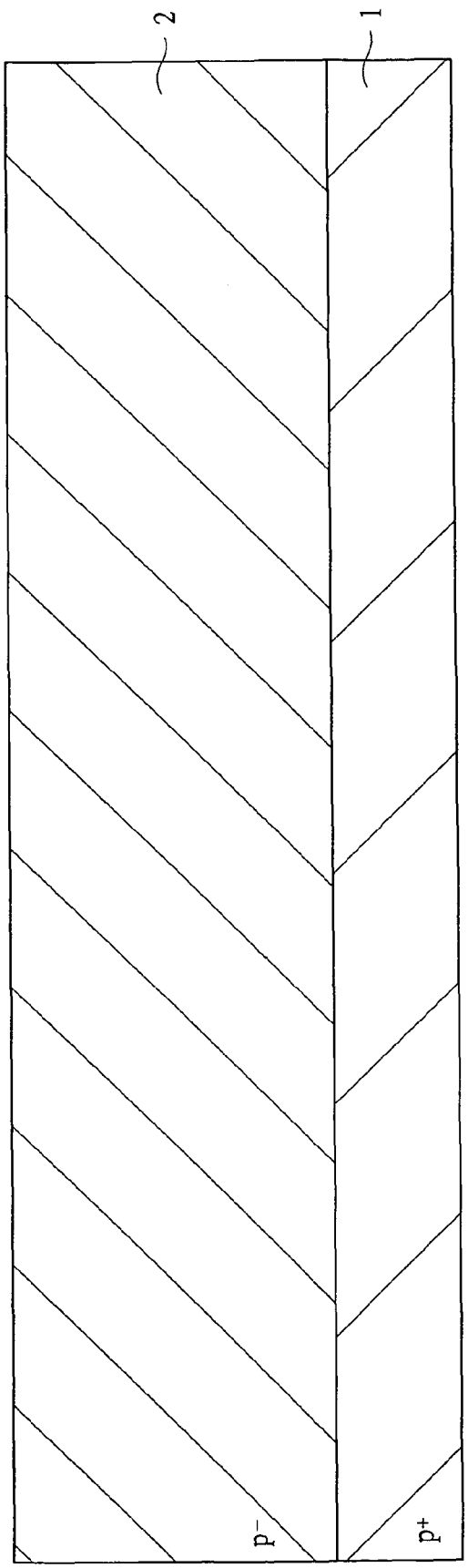
FIG. 8 is a cross-sectional view showing (a) an epitaxial layer forming process in a process flow of a structure embedding the lateral power MOSFET device and a CMOS device according to the first embodiment of the present invention.

First, as shown in FIG. 8, in (a) an epitaxial layer forming process, the p⁺ substrate 1 is prepared and the p⁻ epitaxial layer 2 is formed on the p⁺ substrate 1.

Figure 9:
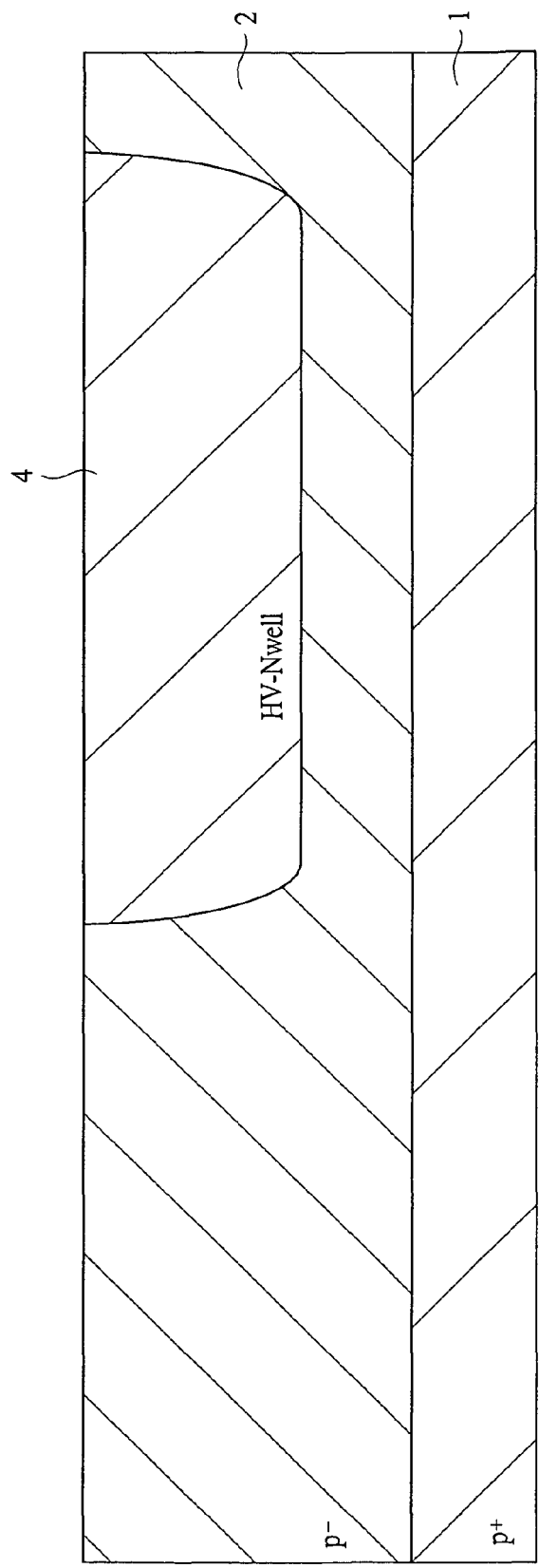
FIG. 9 is a cross-sectional view showing (b) an HV-Nwell layer forming process in the process flow of the structure embedding the lateral power MOSFET device and the CMOS device according to the first embodiment of the present invention.

Next, as shown in FIG. 9, in (b) an HV-Nwell layer forming process, the HV-Nwell layer 4 to be the drift region of the lateral power MOSFET device of the lateral power MOSFET 200 shown in FIG. 19 is formed on the p⁻ epitaxial layer 2 by ion implantation and diffusion.

Figure 10:
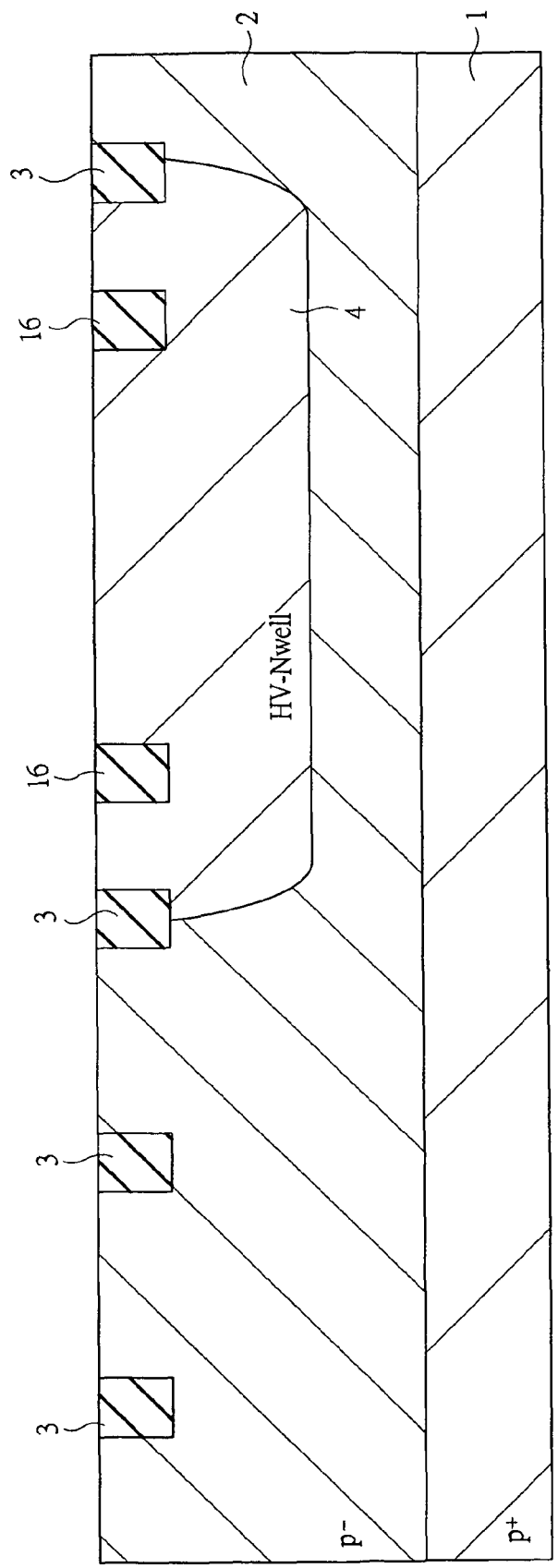
FIG. 10 is a cross-sectional view showing (c) an STI region forming process in the process flow of the structure embedding the lateral power MOSFET device and the CMOS device according to the first embodiment of the present invention.

Next, as shown in FIG. 10, in (c) an STI region forming process, an STI region 3 for device isolation is formed, and the trench regions 16 are formed in the drift region. A method of forming the STI regions 3 and the trench regions 16 is same as the general CMOS process, and the description thereof is omitted herein.

Figure 11:
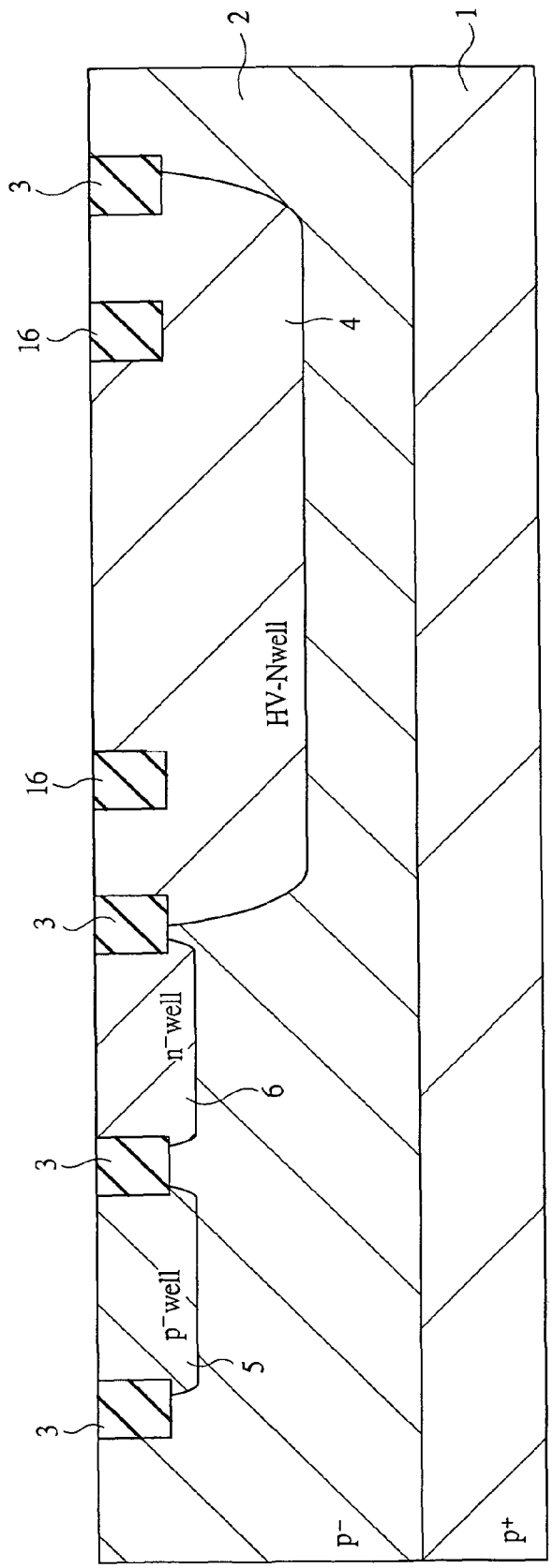
FIG. 11 is a cross-sectional view showing (d) a CMOS well layer forming process in the process flow of the structure embedding the lateral power MOSFET device and the CMOS device according to the first embodiment of the present invention.

Next, as shown in FIG. 11, in (d) CMOS-well layer forming process, a p⁻ well layer 5 and an n⁻ well layer 6 of the CMOS are formed by ion implantation and diffusion.

Figure 12:
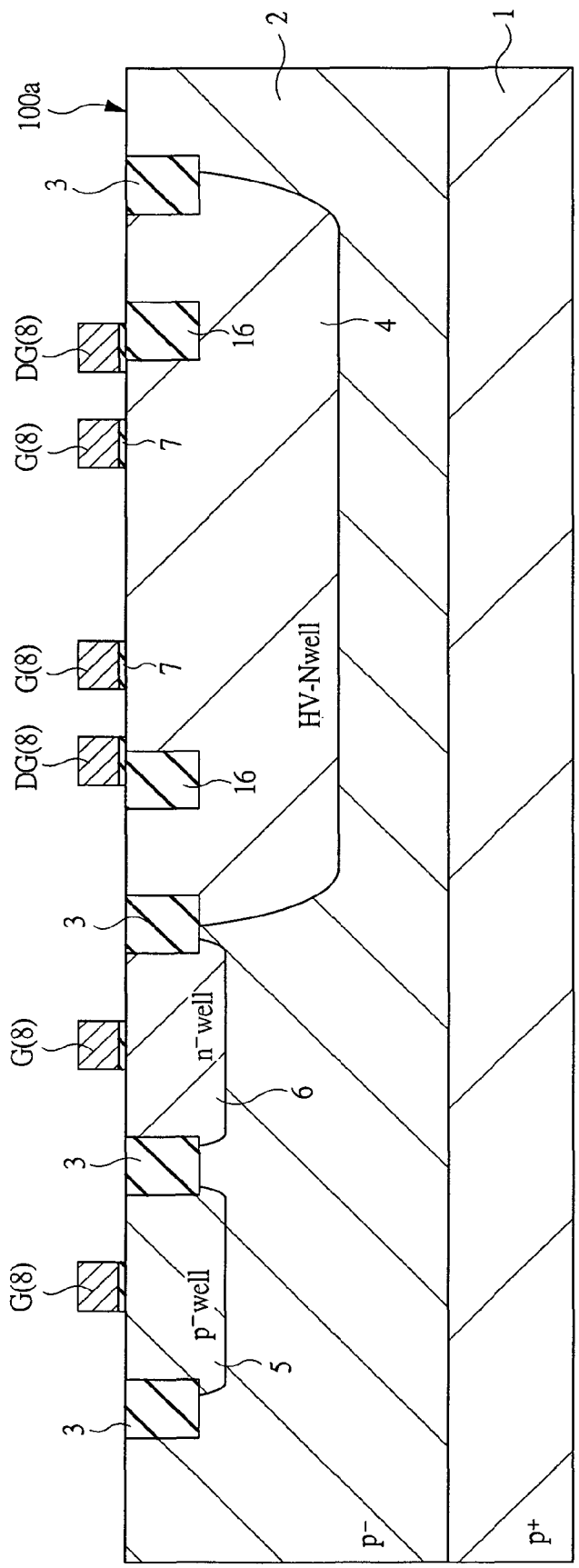
FIG. 12 is a cross-sectional view showing (e) a gate/dummy-gate forming process in the process flow of the structure embedding the lateral power MOSFET device and the CMOS device according to the first embodiment of the present invention.

Next, as shown in FIG. 12, in (e) a gate/dummy-gate forming process, the gate insulating film 7 is formed on the main surface 100a, and then polysilicon 8 is accumulated thereon, and by photo etching, a gate of the CMOS and gates G and dummy gates DG of the lateral power MOSFET are formed.

Herein, in the first embodiment, it is a feature that the gates G and the dummy gates DG can be formed in a same process. That is, there is no need to add a new process in order to manufacture the dummy gates DG of the feature of the first embodiment.

As described above, the gate insulating film 7 may be either an oxide film or an oxynitride film. Further, a thickness of the gate insulating film 7 of the CMOS device and that of the lateral power MOSFET device may be same, or a film of different thickness may be used according to the withstand voltage of the CMOS.

The polysilicon 8 to be the gate electrode G and the dummy gate electrode DG of the lateral power MOSFET 200 may be either n-type polysilicon or p-type polysilicon. Meanwhile, with regard to the polysilicon 8 to become the gate electrode G of the CMOS, n-type polysilicon is used for the nMOS, and p-type polysilicon is used for the pMOS.

Figure 13:
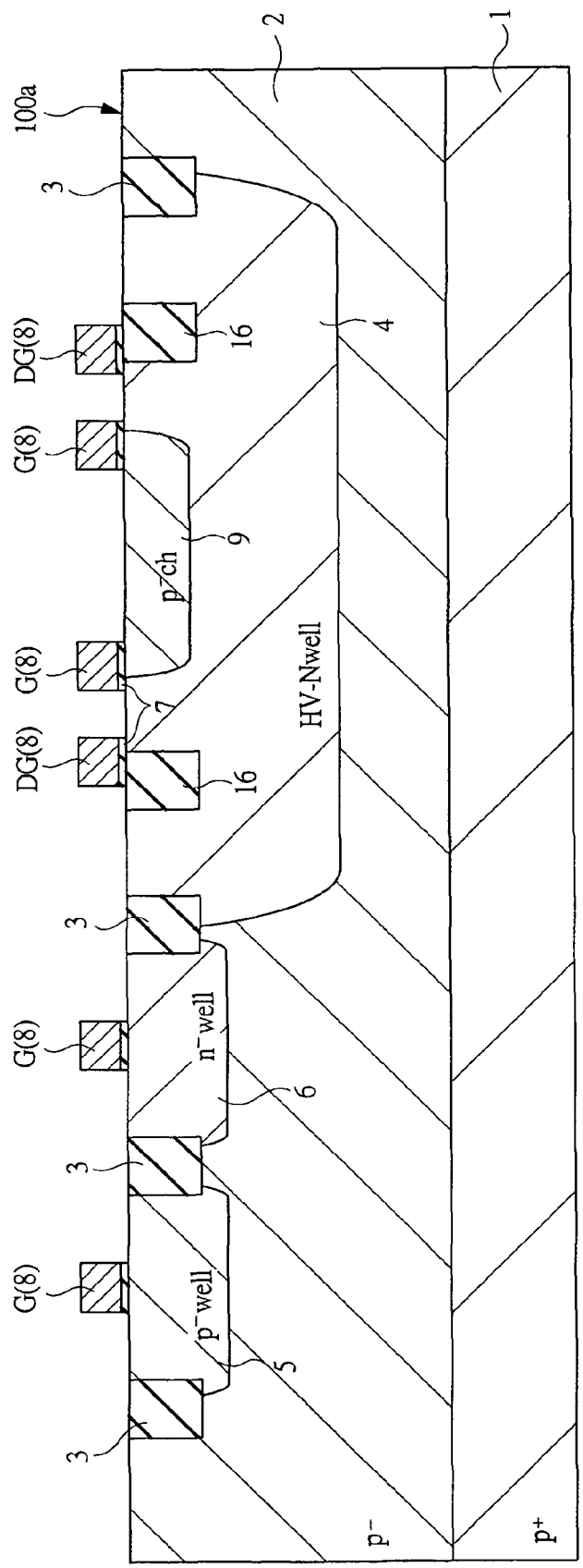
FIG. 13 is a cross-sectional view showing (f) a p$^-$ channel layer forming process in the process flow of the structure embedding the lateral power MOSFET device and the CMOS device according to the first embodiment of the present invention.
Figure 14:
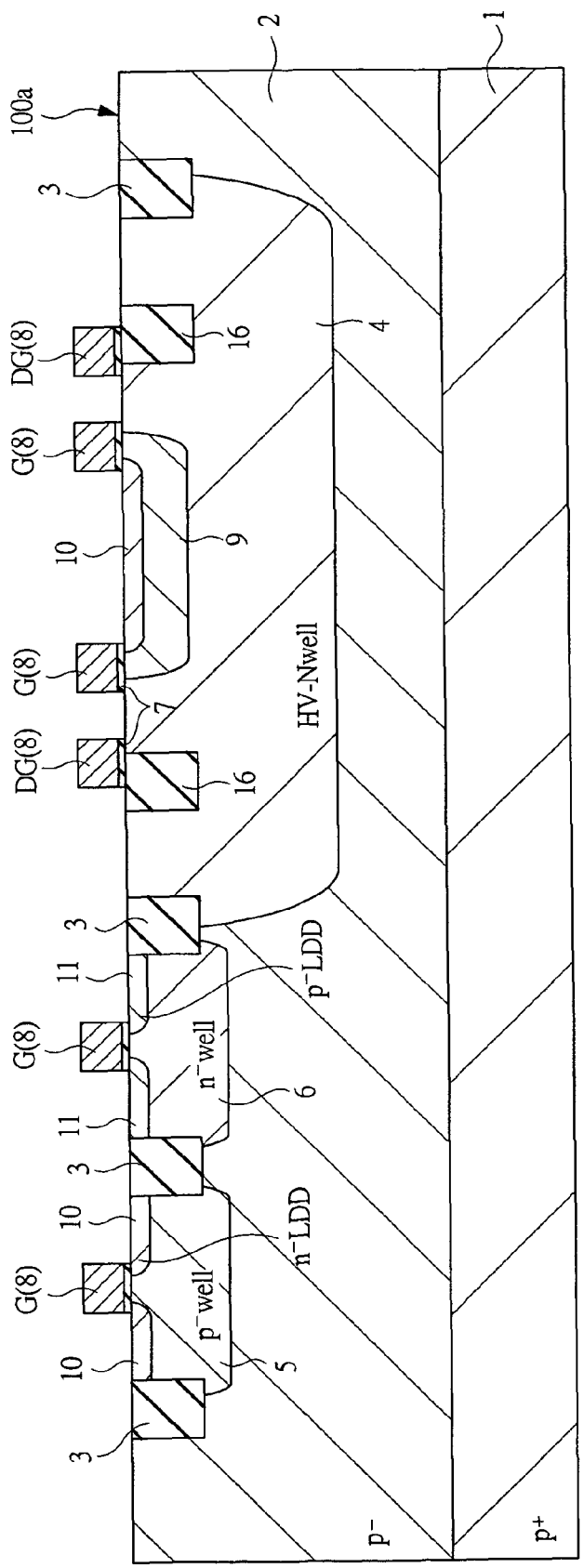
FIG. 14 is a cross-sectional view showing (g) an LDD layer forming process in the process flow of the structure embedding the lateral power MOSFET device and the CMOS device according to the first embodiment of the present invention.

Next, as shown in FIG. 13, in (f) a p⁻ channel layer forming process, the p⁻ channel layer 9 of the lateral power MOSFET is formed by ion implantation and diffusion. Next, as shown in FIG. 14, in (g) an LDD layer forming process, n⁻ LDD layers 10 and p⁻ LDD layers 11 are formed by ion implantation and diffusion.

Figure 15:
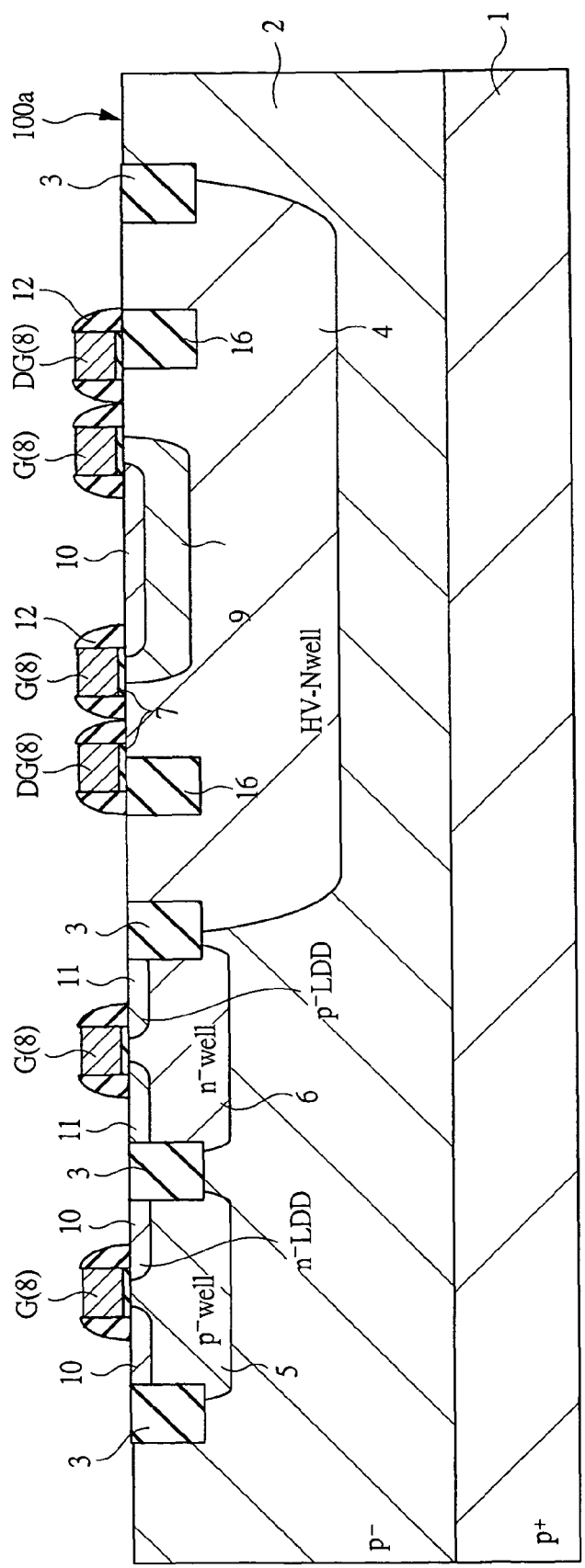
FIG. 15 is a cross-sectional view showing (h) a sidewall forming process in the process flow of the structure embedding the lateral power MOSFET device and the CMOS device according to the first embodiment of the present invention.

Next, as shown in FIG. 15, in (h) a sidewall forming process, sidewalls 12 are formed. Herein, among the sidewalls 12 of the gate electrode G and the dummy gate electrode DG, those sidewalls 12 to be arranged on the sides opposing to each other are formed so as to contact each other.

In other words, it is a feature that the sidewall 12 of the gate electrode G and the sidewall 12 of the dummy gate electrode DG lap over.

Since the sidewalls 12 lap over, saliciding process to be described later herein becomes possible. That is, in (e) the gate/dummy-gate forming process described above, it is necessary to make the distance between the gate electrode G and the dummy gate electrode DG less than the distance at which the sidewalls of themselves lap over each other at least.

Figure 16:
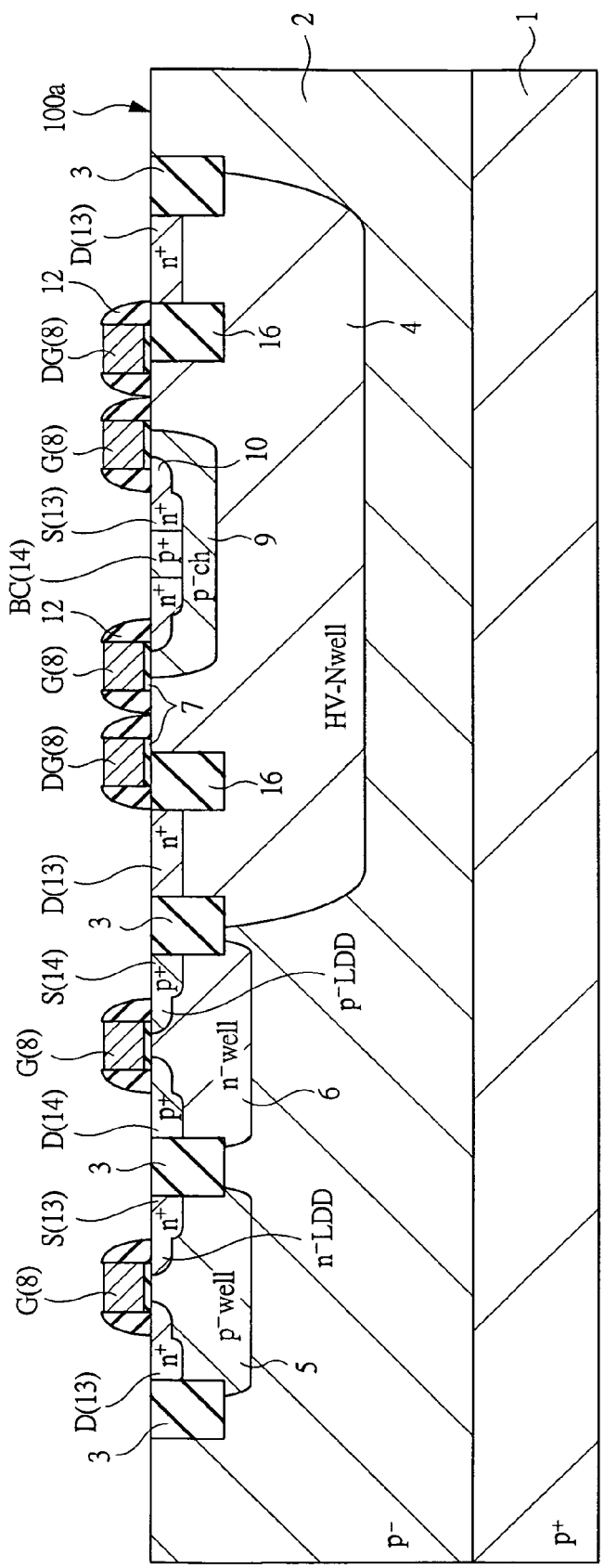
FIG. 16 is a cross-sectional view showing (i) an n$^+$/p$^+$ layer forming process in the process flow of the structure embedding the lateral power MOSFET device and the CMOS device according to the first embodiment of the present invention.

Next, as shown in FIG. 16, in (i) an n⁺/p⁺ layer forming process, n⁺ layers 13 and p⁺ layers 14 to be drain layers D, source layers S, and body contact layers BC are formed by ion implantation and diffusion.

Figure 17:
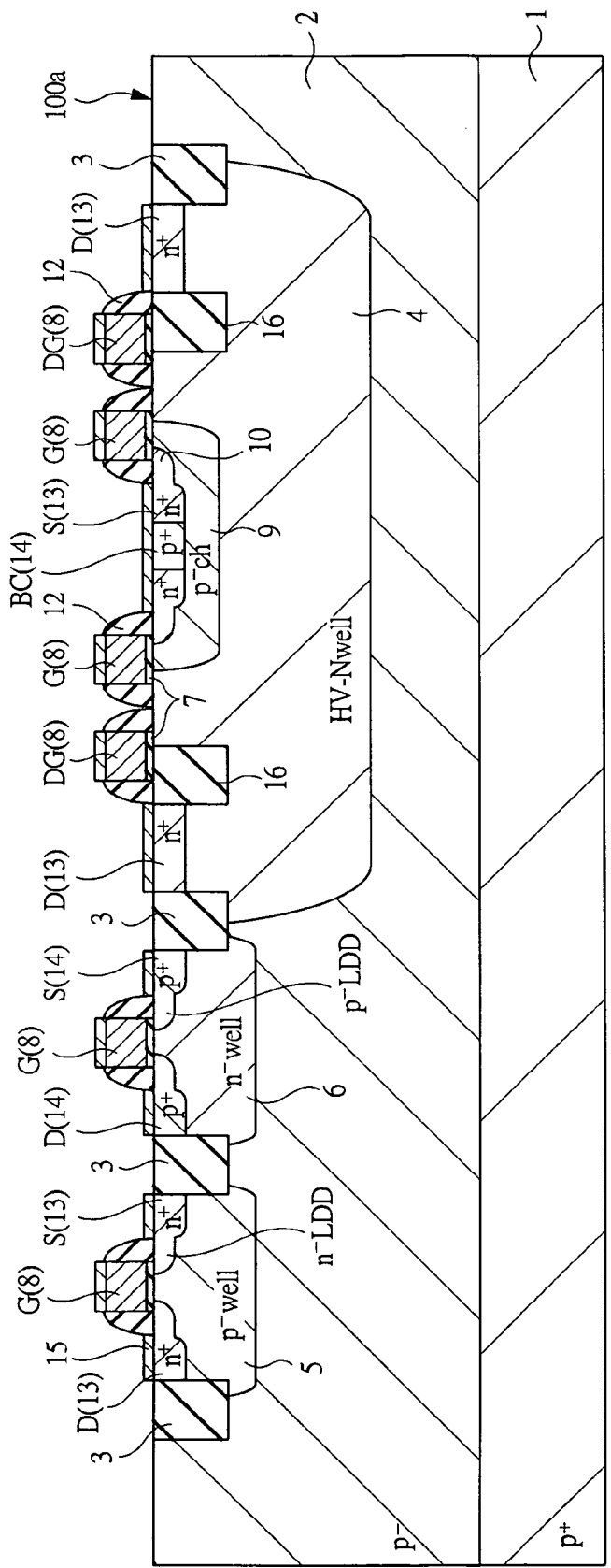
FIG. 17 is a cross-sectional view showing (j) a salicidation process in the process flow of the structure embedding the lateral power MOSFET device and the CMOS device according to the first embodiment of the present invention.

Next, as shown in FIG. 17, in (j) a salicidation process, salicidation of the polysilicon 8 of the diffusion layer and the gate electrode G and the dummy gate electrode DG is performed, so that a silicide layer is formed. As described above, the point in the salicidation is that the sidewalls 12 between the gate electrode G and the dummy gate electrode DG lap over.

If the sidewalls 12 do not lap over, the surface of the HV-Nwell layer 4 as the drift region is silicided, which leads to the withstand voltage lowering, the increase of leakage current and the like. In the first embodiment, by making the sidewalls 12 lap over, it is possible to prevent the surface of the HV-Nwell layer 4 from being silicided.

Figure 18:
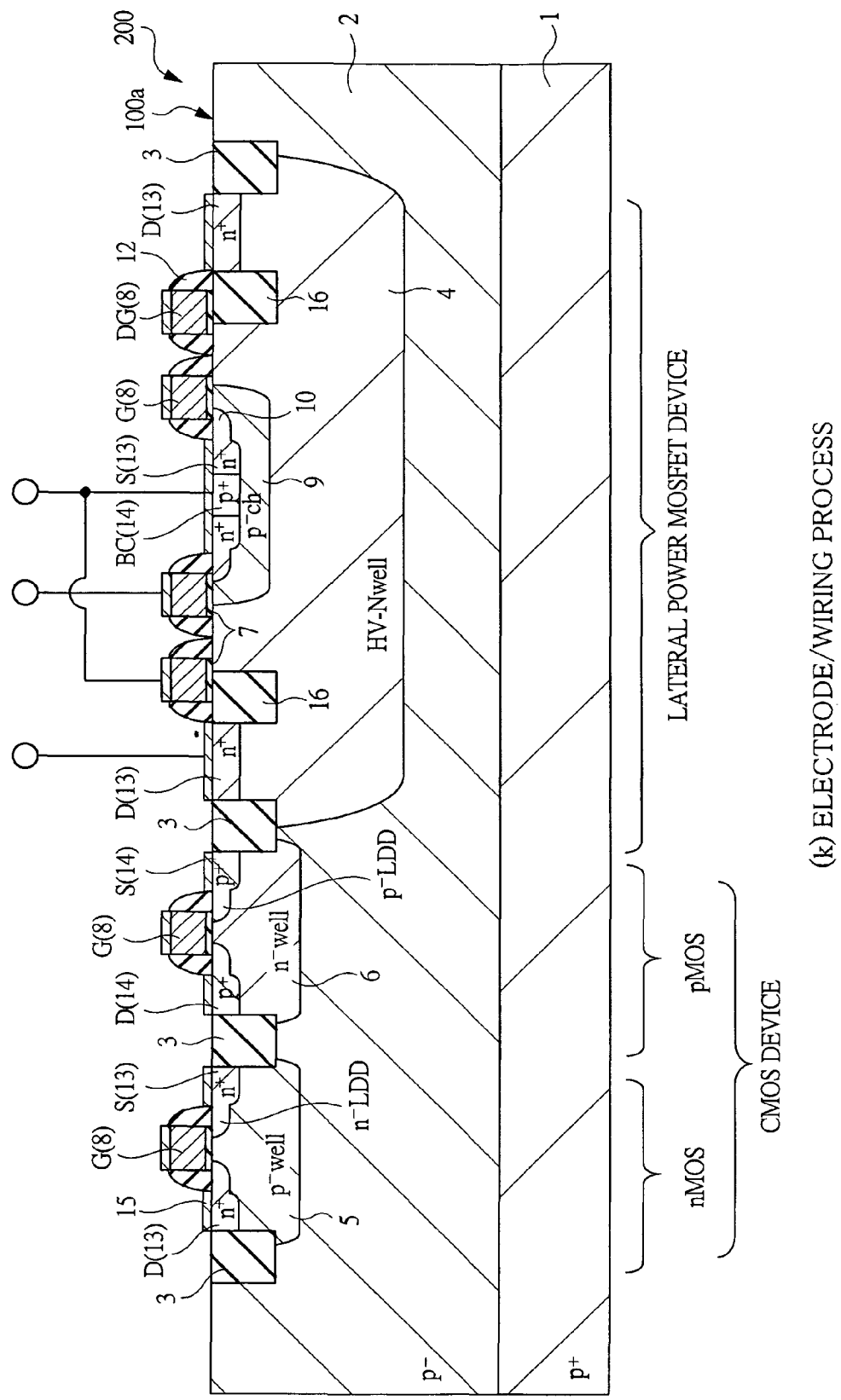
FIG. 18 is a cross-sectional view showing (k) an electrode/wiring process in the process flow of the structure embedding the lateral power MOSFET device and the CMOS device according to the first embodiment of the present invention.

Further, as the silicide layer, cobalt silicide ($CoSi_2$) or titanium silicide ($TiSi_2$) that are used in the general CMOS process may be employed. Finally, as shown in FIG. 18, by (k) an electrode/wiring process, the device is completed.

FIG. 29 is an explanatory diagram showing how to draw out the gate electrode and the dummy gate electrode of the lateral power MOSFET according to the first embodiment. In FIG. 29, for easy understanding, a plane view in a state before forming the silicide layer in the (j) the salicidation process is shown.

In FIG. 29, the gate electrode G and the dummy gate electrode DG have an ultrafine structure. Therefore, as shown in FIG. 29, to the gate electrode G and the dummy gate electrode DG, a drawing region 28 is formed by polysilicon respectively.

Furthermore, on the side walls inside of the respective drawing regions 28, sidewalls 12 are formed, and a part of them are arranged to lap over the sidewalls 12 formed around the gate electrode G and the dummy gate electrode DG.

In the wiring process, a wiring is carried out on the drawing region 28, and the dummy gate electrode DG and the source electrode S are connected, and a wiring connected to the gate electrode G is made.

The effects of the processes of the first embodiment are summarized as the following.

Firstly, by only adding the ion implantation and the diffusion process for two kinds of the HV-Nwell layer formation and the p⁻ channel layer formation to the general CMOS process, it is possible to manufacture a driver-embedded power MOSFET.

Secondly, it is possible to manufacture the dummy gate electrode DG by use of the same process as the processing of the gate electrode G.

Thirdly, by making the sidewalls of the gate electrode G and the dummy gate electrode DG lap over, the salicidation process becomes possible.

Fourthly, since the CMOS device and the lateral power MOSFET device can be manufactured in a same chip, it is possible to manufacture a driver-embedded power MOSFET.

Second Embodiment

Figure 20:
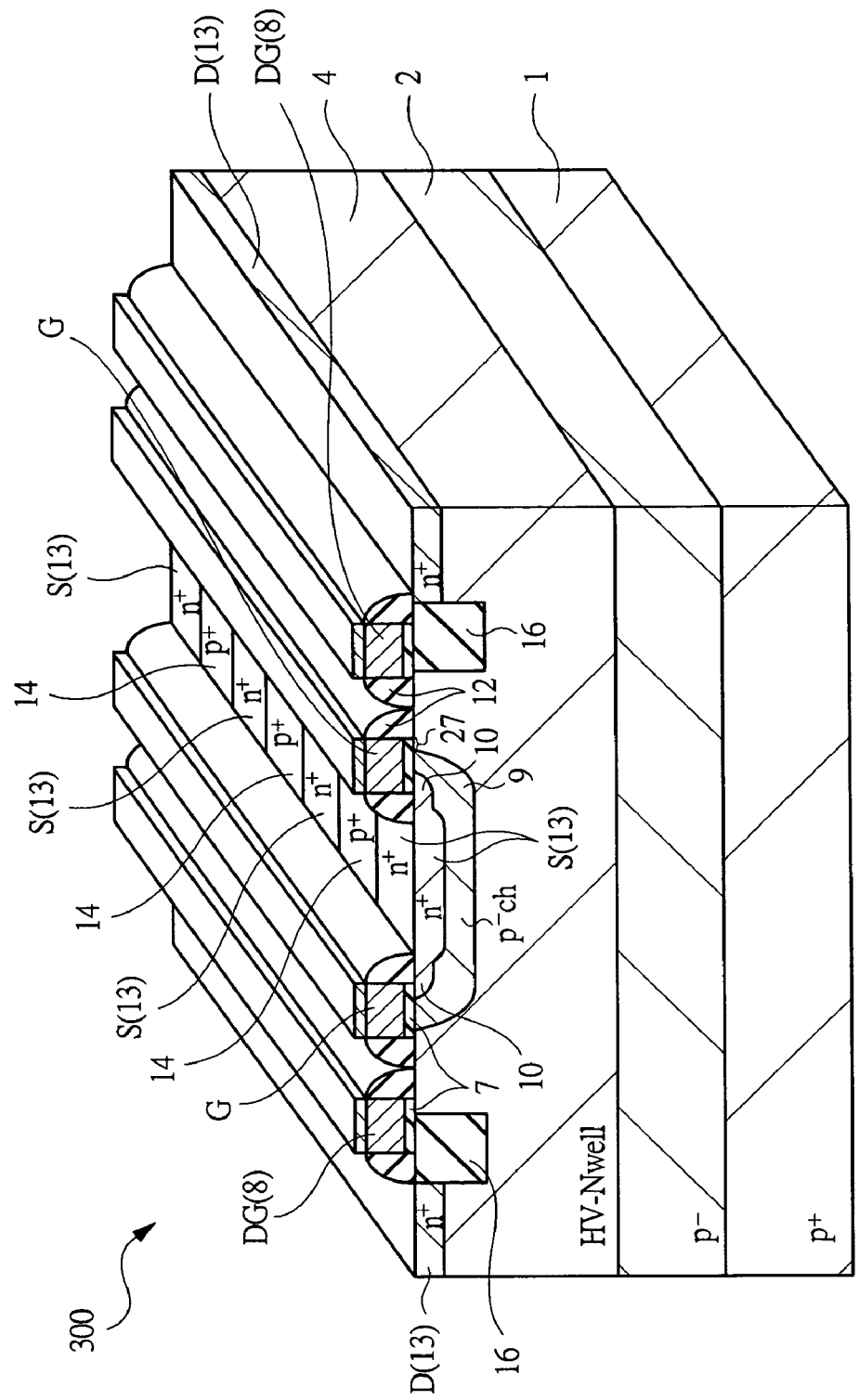
FIG. 20 is a cross-sectional view showing a lateral power MOSFET according to a second embodiment of the present invention.

FIG. 20 is a perspective view showing a structure of a lateral power MOSFET 300 according to a second embodiment of the present invention. A feature of the second embodiment is that the source layer S and the body contact layer BC are arranged alternately along a second direction intersecting with a first direction which is the arrangement direction of the source layer S, the gate electrode G and the drain layer D.

By arranging the source layer S and the body contact layer BC alternately along the second direction, it is possible to make the cell size further smaller than in the lateral power MOSFET 100 described in the first embodiment. Further, by making the cell size smaller, it is possible to reduce the ON resistance.

Third Embodiment

Figure 21:
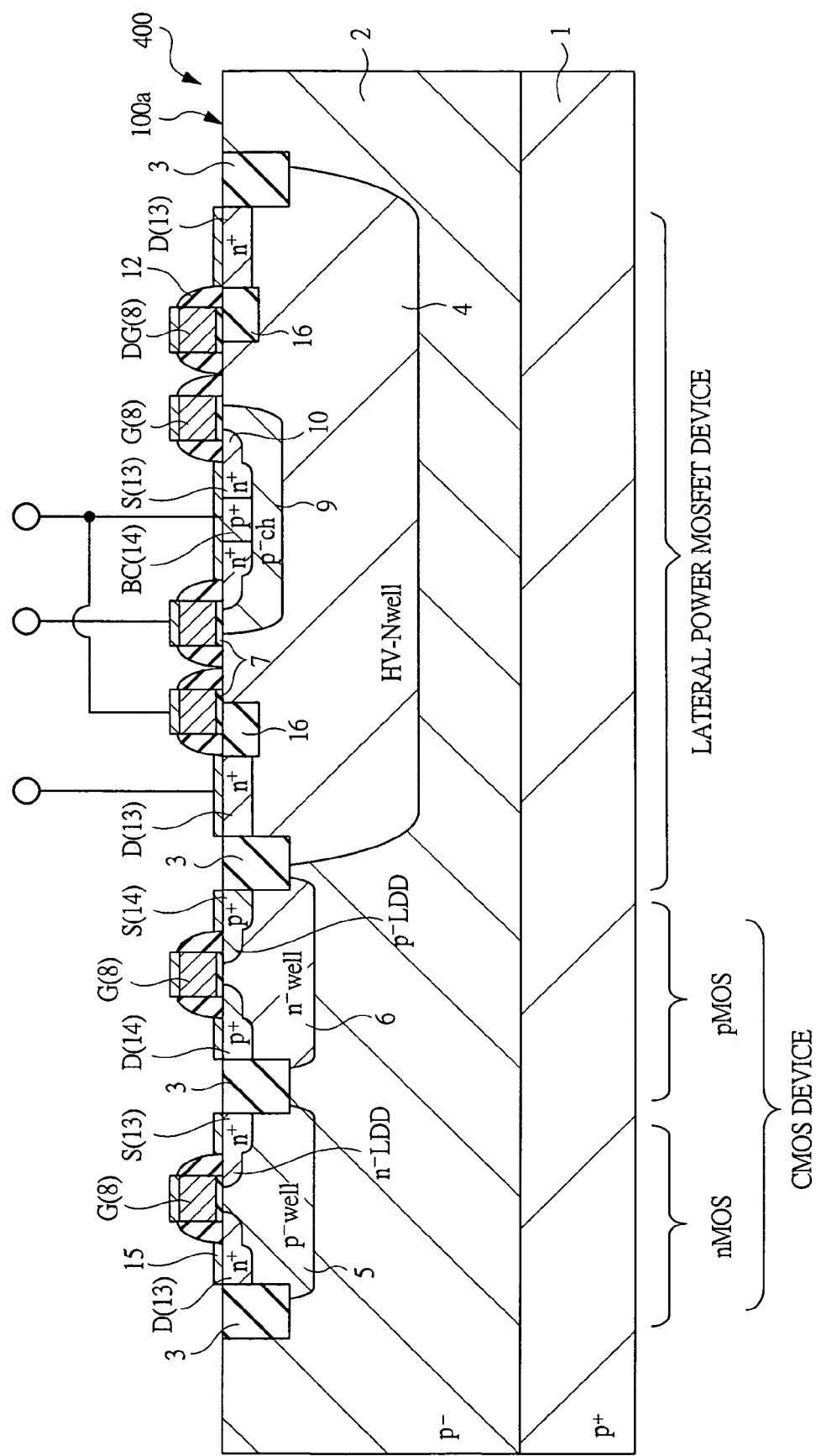
FIG. 21 is a cross-sectional view showing a lateral power MOSFET according to a third embodiment of the present invention.

FIG. 21 is a cross-sectional view showing a structure of a lateral power MOSFET 400 according to a third embodiment of the present invention. A feature of the third embodiment is that the trench region 16 in a drift region of the lateral power MOSFET 400 is shallower than the STI region for device isolation (the first device isolation region and the second device isolation region) 3.

As shown in FIG. 21, the lateral power MOSFET 400 has a CMOS device structured by an nMOS device and a pMOS device, and a lateral power MOSFET device in a same chip. Between the lateral power MOSFET device and the CMOS device, the STI region 3 as a first device isolation region is formed. Further, between the nMOS device and the PMOS device structuring the CMOS device, the STI region 3 as a second device isolation region is formed.

Furthermore, the depth in a direction from the main surface 100a of the STI region 3 formed in the HV-Nwell layer 4 as the drift region of the lateral power MOSFET device to the inside of the semiconductor is formed shallower than the depth in the direction from the main surface 100a of the STI region 3 as the first device isolation region and the second device isolation region to the inside of the semiconductor.

In the general CMOS process, the depth of the STI region as a device isolation region is about 0.5 μm. However, the depth of the trench region 16 necessary for obtaining a withstand voltage around 30 V in the lateral power MOSFET is about 0.25 μm.

Figure 22:
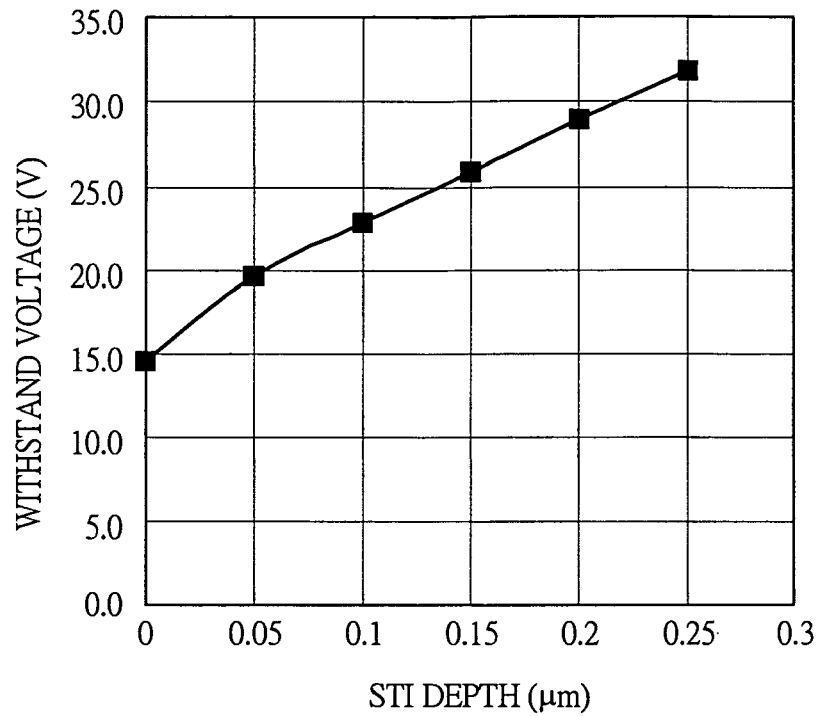
FIG. 22 is an explanatory diagram showing a dependence of a withstand voltage between a drain and source to a depth of an STI region (STI-region depth dependence) of the lateral power MOSFET according to the third embodiment of the present invention.

FIG. 22 is an explanatory diagram showing an STI depth dependence of withstand voltage between the drain and source of the structure according to the present invention by calculations. It is shown that if the depth of the trench region 16 is about 0.25 μm as shown in FIG. 22, a withstand voltage around 30 V can be obtained.

Figure 23:
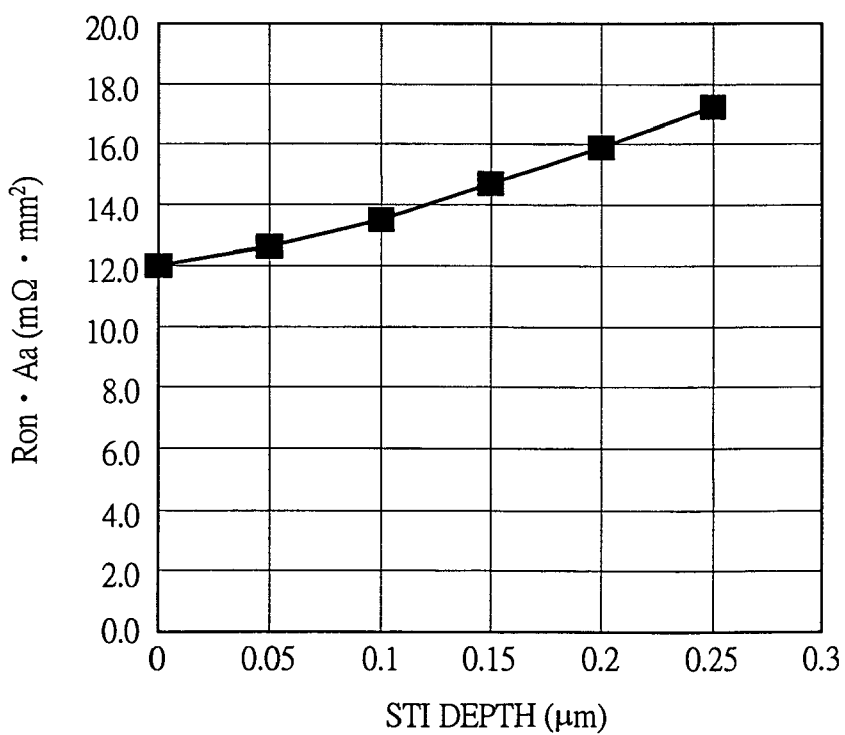
FIG. 23 is an explanatory diagram showing the STI-region depth dependence of an ON resistance of the lateral power MOSFET according to the third embodiment of the present invention.

On the other hand, in the study on the ON resistance, as shown in FIG. 5 described in the first embodiment, as the trench region 16 becomes deeper, the ON resistance becomes higher due to the current path passing through the trench region 16. FIG. 23 is an explanatory diagram showing the STI depth dependence of the ON resistance according to calculations of the lateral power MOSFET where the trench region is formed in the drift region.

As shown in FIG. 23, the ON resistance becomes larger in proportion with the STI depth. Accordingly, by making the trench region 16 in the drift region of the lateral power MOSFET 400 shallower than the STI region 3 for device isolation, it becomes possible to maintain the withstand voltage around 30 V, and also reduce the ON resistance.

As the process for obtaining the lateral power MOSFET 400, in (c) the STI-region forming process described in the first embodiment, silicon etching for forming the trench structure may be carried out separately to the trench region 16 in the drift region and to the STI region 3 for device isolation.

Fourth Embodiment

Figure 24:
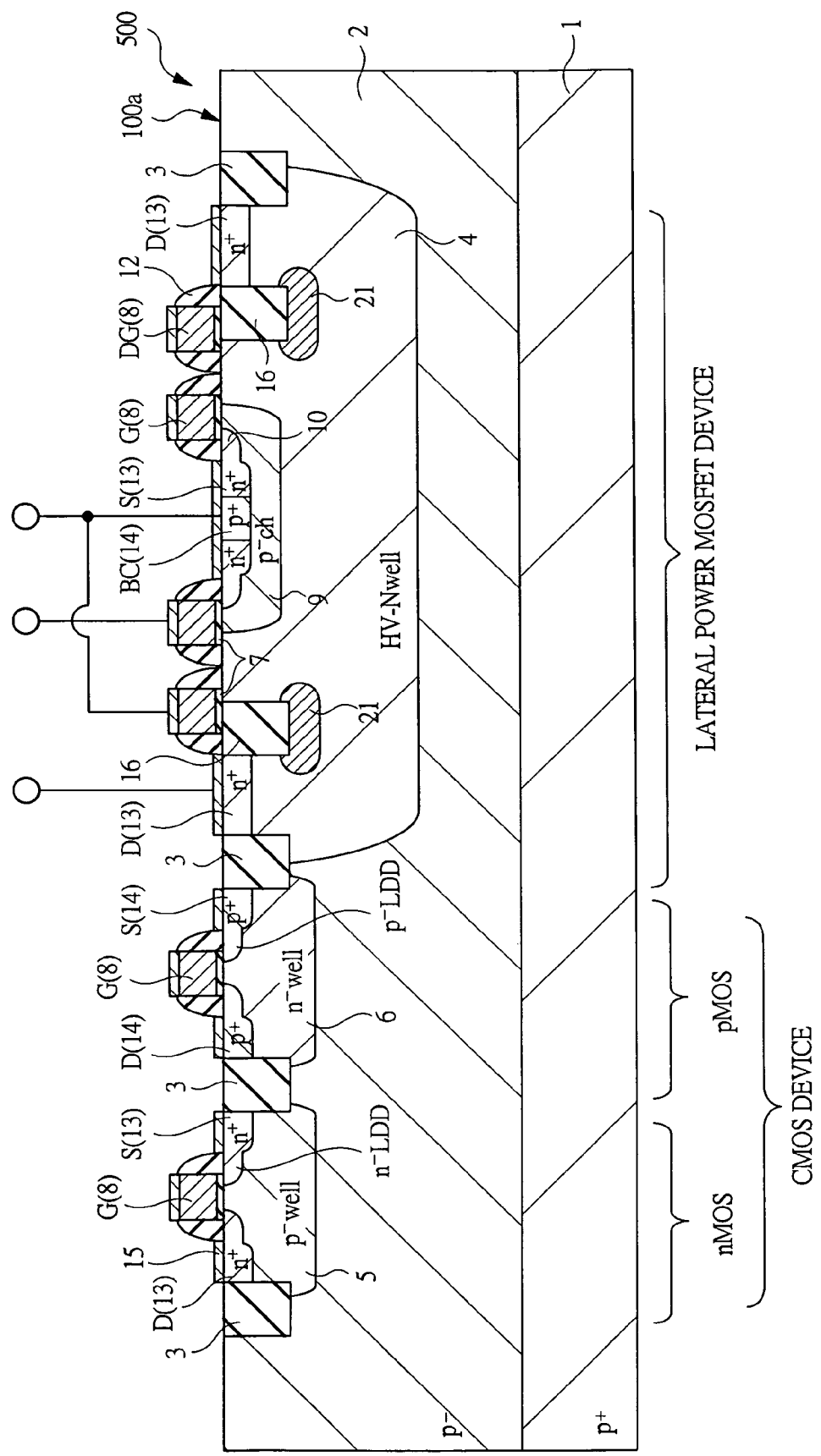
FIG. 24 is a cross-sectional view of a lateral power MOSFET according to a fourth embodiment of the present invention.
Figure 25:
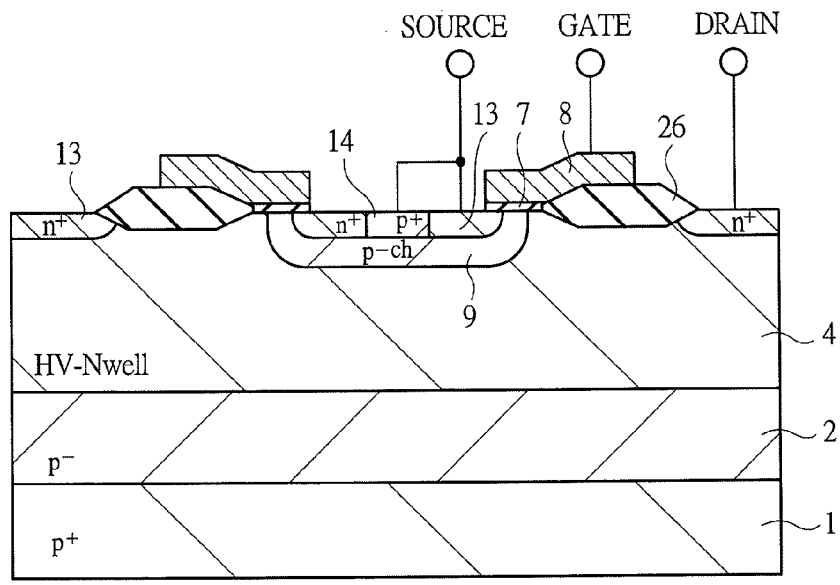
FIG. 25 is a cross-sectional view showing a lateral power MOSFET having the LOCOS in a drift region thereof as a comparative example of the present invention.
Figure 26:
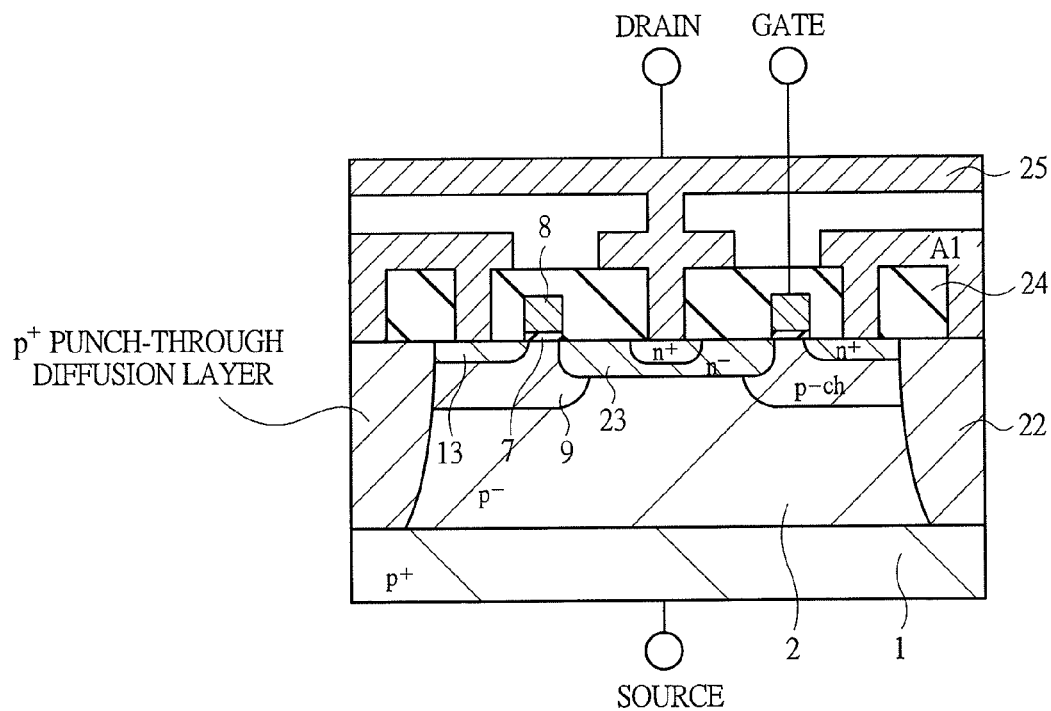
FIG. 26 is a cross-sectional view showing an RF lateral power MOSFET as a comparative example of the present invention.

FIG. 24 shows a cross-sectional view of a lateral power MOSFET 500 according to a fourth embodiment of the present invention. A feature of the fourth embodiment is that just under the trench region 16 in the drain region of the lateral power MOSFET 100 descried in the first embodiment (on the surface positioned at the opposite side to the main surface 100a of the trench region 16), an n layer 21 having a concentration higher than that of the HV-Nwell layer 4 is added.

In FIG. 24, in the lateral power MOSFET 500 according to the fourth embodiment, the STI region 3 for device isolation and the trench region 16 in the drift region have a same depth (about 0.5 μm).

Further, on a lower surface side of the trench region 16 in the drift region, an n layer 21 having an impurity concentration higher than that of the HV-Nwell layer 4 is added. In the lateral power MOSFET 500, by forming the n layer 21 of a high-impurity-concentration layer having a lower resistance than that of the HV-Nwell layer 4 on the lower surface side of the trench region to be a current path, it becomes possible to reduce the ON resistance.

Furthermore, by adding the n layer 21 to the lateral power MOSFET 100 described in the first embodiment, although the withstand voltage is lowered, since the trench region is as deep as around 0.5 μm, a withstand voltage around 30 V can be obtained.

As the process to obtain the lateral power MOSFET 500, in (c) the STI region forming process described in the first embodiment, silicon etching for forming the trench structure may be carried out, and thereafter, impurities may be introduced to only the lower portion of the trench region 16 in the drift region by ion implantation, and the n layer 21 may be formed.

In the foregoing, the invention made by the inventors of the present invention has been concretely described based on the embodiments mainly about the n-channel type lateral power MOSFET. However, it is needless to say that the present invention is not limited to the foregoing embodiments and various modifications and alterations can be made within the scope of the present invention. For example, the present invention is applicable to a p-channel type lateral MOSFET.

The present invention is applicable to a power MISFET (Metal Insulator Semiconductor Field Effect Transistor). More particularly, the present invention is applicable to a low-withstand-voltage power MISFET having a withstand voltage of 30 V or less.

What is claimed is:

1. A power MISFET comprising a semiconductor substrate having at least one main surface,
wherein, the main surface of the semiconductor substrate has a source region, a channel region, a drift region, and a drain region arranged thereon in sequence along the main surface of the semiconductor substrate,
the drift region includes a trench region which is shallower than the drift region formed therein in a direction from the main surface of the semiconductor substrate to the inside of the semiconductor substrate,
an inside of the trench region is filled with a first insulating film,
the main surface of the semiconductor substrate has:
a gate electrode layer arranged on the channel region interposing a second insulating film; and
a dummy gate electrode layer arranged on the drift region and the first insulating film interposing a third insulating film thereon,
a plane arrangement of the main surface of the semiconductor substrate is such that:
the source region and the drain region are arranged at opposite sides to each other across the gate electrode layer, and the gate electrode layer does not overlap the first insulating film, and
the dummy gate electrode layer is arranged separately from the gate electrode layer between the gate electrode layer and the drain region, an edge portion of the dummy gate electrode layer at the drain region side overlaps the first insulating film and an edge portion of the dummy gate electrode layer at the source region side overlaps the drift region, and
the dummy gate electrode layer is electrically connected with the source region.

2. The power MISFET according to claim 1,
wherein the gate electrode layer and the dummy gate electrode layer are formed in a same process.

3. The power MISFET according to claim 2,
wherein a material of the gate electrode layer and the dummy gate electrode layer is polysilicon.

4. The power MISFET according to claim 1,
wherein, on both side surfaces of the gate electrode layer and the dummy gate electrode layer, sidewalls are formed respectively, and among the sidewalls, those sidewalls formed at surfaces opposing to each other are contacted with each other.

5. The power MISFET according to claim 4,
wherein upper surfaces of the gate electrode layer and the dummy gate electrode layer,
an upper surface of the drain region, and
an upper surface of the source region have a silicide layer formed thereon.

6. The power MISFET according to claim 5,
wherein the silicide layer is cobalt silicide or titanium silicide.

7. The power MISFET according to claim 1,
wherein, on a bottom surface side of the trench region, an impurity region having a same conducting type as that of the drift region and a higher concentration than that of the drift region is formed.

8. A semiconductor device comprising a semiconductor substrate having at least one main surface,
wherein, the semiconductor substrate of a same chip includes a lateral power MISFET device and a CMOS driver device for driving the lateral power MISFET device,
in the lateral power MISFET device,
the main surface of the semiconductor substrate has a source region, a channel region, a drift region, and a drain region arranged thereon in sequence along the main surface of the semiconductor substrate,
the drift region includes a trench region which is shallower than the drift region formed therein in a direction from the main surface of the semiconductor substrate to the inside of the semiconductor substrate,
an inside of the trench region is filled with a first insulating film,
the main surface of the semiconductor substrate has:
a gate electrode layer arranged on the channel region interposing a second insulating film; and
a dummy gate electrode layer arranged on the drift region and the first insulating film interposing a third insulating film thereon,
a plane arrangement of the main surface of the semiconductor substrate is such that:
the source region and the drain region are arranged at opposite sides to each other across the gate electrode layer, and the gate electrode layer does not overlap the first insulating film, and
the dummy gate electrode layer is arranged separately from the gate electrode layer between the gate electrode layer and the drain region, an edge portion of the dummy gate electrode layer at the drain region side overlaps the first insulating film and an edge portion of the dummy gate electrode layer at the source region side overlaps the drift region, and
the dummy gate electrode layer is electrically connected with the source region.

9. The semiconductor device according to claim 8, further comprising:
a first device isolation region that isolates a device region of the CMOS driver device from a device region of the lateral power MISFET device; and
a second device isolation region that isolates a plurality of device regions that the CMOS driver device are included,
wherein a depth of the trench region in a direction from the main surface to the inside is shallower than depths of the first device isolation region and the second device isolation region.

10. A DC/DC converter comprising a high-side switch and a low-side switch,
wherein a lateral power MISFET is used to at least either one of the high-side switch and the low-side switch,
the lateral power MISFET comprises a semiconductor substrate having at least one main surface,
the main surface of the semiconductor substrate has a source region, a channel region, a drift region, and a drain region arranged in sequence along the main surface of the semiconductor substrate,
in the drift region, a trench region which is shallower than the drift region formed therein is arranged in a direction from the main surface of the semiconductor substrate to the inside of the semiconductor substrate,
an inside of the trench region is filled with a first insulating film,
the main surface of the semiconductor substrate has:
a gate electrode layer arranged on the channel region interposing a second insulating film; and
a dummy gate electrode layer arranged on the drift region and the first insulating film interposing a third insulating film thereon,
a plane arrangement of the main surface of the semiconductor substrate is such that:
the source region and the drain region are arranged at opposite sides to each other across the gate electrode layer, and the gate electrode layer does not overlap the first insulating film, and
the dummy gate electrode layer is arranged separately from the gate electrode layer between the gate electrode layer and the drain region, an edge portion of the dummy gate electrode layer at the drain region side overlaps the first insulating film and an edge portion of the dummy gate electrode layer at the source region side overlaps the drift region, and
the dummy gate electrode layer is electrically connected with the source region.

11. The DC/DC converter according to claim 10,
wherein the lateral power MISFET comprises a lateral power MISFET device and a CMOS driver device for driving the lateral power MISFET device.

* * * * *